(12) United States Patent
Lyons et al.

(10) Patent No.: US 8,047,235 B2
(45) Date of Patent: Nov. 1, 2011

(54) FLUID-PERMEABLE BODY HAVING A SUPERHYDROPHOBIC SURFACE

(75) Inventors: Alan Michael Lyons, New Providence, NJ (US); John Mullins, Dublin (IE); Michael Joseph Schabel, Clark, NJ (US)

(73) Assignee: Alcatel Lucent, Paris (FR)

( * ) Notice: Subject to any disclaimer, the term of this patent is extended or adjusted under 35 U.S.C. 154(b) by 1142 days.

(21) Appl. No.: 11/607,134

(22) Filed: Nov. 30, 2006

(65) Prior Publication Data

US 2008/0131653 A1    Jun. 5, 2008

(51) Int. Cl.
F15D 1/02    (2006.01)
(52) U.S. Cl. ............................ 138/39; 138/38
(58) Field of Classification Search .................. 138/38, 138/39, 104
See application file for complete search history.

(56) References Cited

U.S. PATENT DOCUMENTS

| | | | | |
|---|---|---|---|---|
| 3,267,563 | A | * | 8/1966 | Seaton ..................... 29/890.036 |
| 3,633,753 | A | * | 1/1972 | Petitjean ....................... 210/356 |
| 4,044,797 | A | * | 8/1977 | Fujie et al. ....................... 138/38 |
| 4,222,434 | A | * | 9/1980 | Clyde ............................ 165/10 |
| 4,324,571 | A | * | 4/1982 | Johnson, Jr. ..................... 55/302 |
| 4,402,359 | A | * | 9/1983 | Carnavos et al. ............... 165/70 |
| 4,621,953 | A | * | 11/1986 | McGuth ........................ 406/193 |
| 5,094,749 | A | | 3/1992 | Seita |
| 6,032,726 | A | * | 3/2000 | Wright et al. ............. 165/109.1 |
| 6,185,961 | B1 | | 2/2001 | Tonucci et al. ................ 65/60.4 |
| 6,357,522 | B2 | * | 3/2002 | Dienhart et al. .............. 165/183 |
| 6,634,388 | B1 | * | 10/2003 | Taylor et al. .................. 138/114 |
| 6,655,451 | B2 | * | 12/2003 | Tada et al. ..................... 165/179 |
| 7,048,889 | B2 | | 5/2006 | Arney et al. ................. 422/68.1 |
| 2002/0125192 | A1 | | 9/2002 | Lopez et al. .................. 210/656 |
| 2004/0191127 | A1 | | 9/2004 | Kornblit et al. ............... 422/100 |
| 2004/0209047 | A1 | * | 10/2004 | Extrand et al. ................ 428/156 |
| 2005/0039661 | A1 | | 2/2005 | Kornblit et al. ............. 114/67 R |
| 2005/0069458 | A1 | | 3/2005 | Hodes et al. .................... 422/99 |
| 2005/0269743 | A1 | | 12/2005 | Kroupenkine et al. ........ 264/291 |
| 2006/0255171 | A1 | | 11/2006 | Krupenkin et al. ............. 239/44 |
| 2007/0048858 | A1 | | 3/2007 | Aizenberg et al. ......... 435/287.2 |

FOREIGN PATENT DOCUMENTS

EP    1 473 079 A1    11/2004
EP    1591415           11/2005

OTHER PUBLICATIONS

U.S. Appl. No. 11/387,518, filed Mar. 23, 2006, Krupenkin et al.
U.S. Appl. No. 11/416,893, filed May 3, 2006, Kempers et al.

(Continued)

*Primary Examiner* — James F Hook
(74) *Attorney, Agent, or Firm* — Jay M. Brown

(57) ABSTRACT

Apparatus including a rigid fluid-permeable body, having a first non-planar fluid-permeable body surface, and having a second fluid-permeable body surface; a plurality of fluid-permeable cells in the fluid-permeable body; and a plurality of raised micro-scale features on the first fluid-permeable body surface. Apparatus including a fluid-permeable body having first and second fluid-permeable body surfaces; a plurality of fluid-permeable cells in the fluid-permeable body; a plurality of raised micro-scale features on the first fluid-permeable body surface; and a fluid containment body forming, together with the second fluid-permeable body surface, a second fluid containment structure. Methods, utilizing an apparatus, of treating a liquid with a fluid, and of maintaining a superhydrophobic surface.

25 Claims, 10 Drawing Sheets

OTHER PUBLICATIONS

Vincent J. Cahill, "A Short History and Current Developments of UV-Curing for Ink Jet Printing", Radtech Report, vol. 21, 10 pgs, Jul./Aug. 2001.

Metin Sitti, "High Aspect Ratio Polymer Micro/Nano-Structure Manufacturing using Nanoembossing, Nanomolding and Directed Self-Assembly", 5 pgs, to appear in the IEEE/ASME Advanced Mechatronics Conference, Kobe, Japan, Jul. 2003.

News Release, "3D Systems displays high-resolution parts at the BaselWorld Jewelry Show 2004", 3 pgs, Apr. 14, 2004.

"InVision™ HR 3-D Printer: High resolution 3-D printing for jewelry and other precision casting patterns", 2 pgs, Mar. 23, 2005.

Choi et al., "Large Slip of Aqueous Liquid Flow over a Nanoengineered Superhydrophobic Surface", Physical Review Letters 96, 066001, 4 pgs, Feb. 17, 2006.

"Inkjets", 3 pgs, printed on Apr. 6, 2006 from http://home.att.net/~castleisland/ink_int.htm.

"Rapid Prototyping: Ink Jet", 5 pgs, printed on Apr. 6, 2006 from http:/www.efunda.com/processes/rapid_prototyping/inkjet.cfm.

"InVision™ HR 3-D Printer", 2 pgs, printed on Apr. 6, 2006 from http://www.3dsystems.com/products/multijet/invisionHR/index.asp.

V. Ryan, "Rapid Prototyping—The 3D Printer", 10 pgs, printed on Apr. 6, 2006 from http://www.technologystudent.com/cam/prn3d1.htm.

"Three Dimensional Printing", 2 pgs, printed on Apr. 6, 2006 from http://home.att.net/~castleisland/3dp_int.htm.

"What Is Rapid Prototyping?", 3 pgs, printed on Apr. 6, 2006 from http://home.att.net/~castleisland/rp_int.htm.

"Stereolithography", 2 pgs, printed on Apr. 6, 2006 from http://home.att.net/~castleisland/sla_int.htm.

"Stratasys® Rapid Prototyping Product Comparisons", 2 pgs, printed on Apr. 18, 2006 from http://www.stratasys.com/sys_main.html.

* cited by examiner

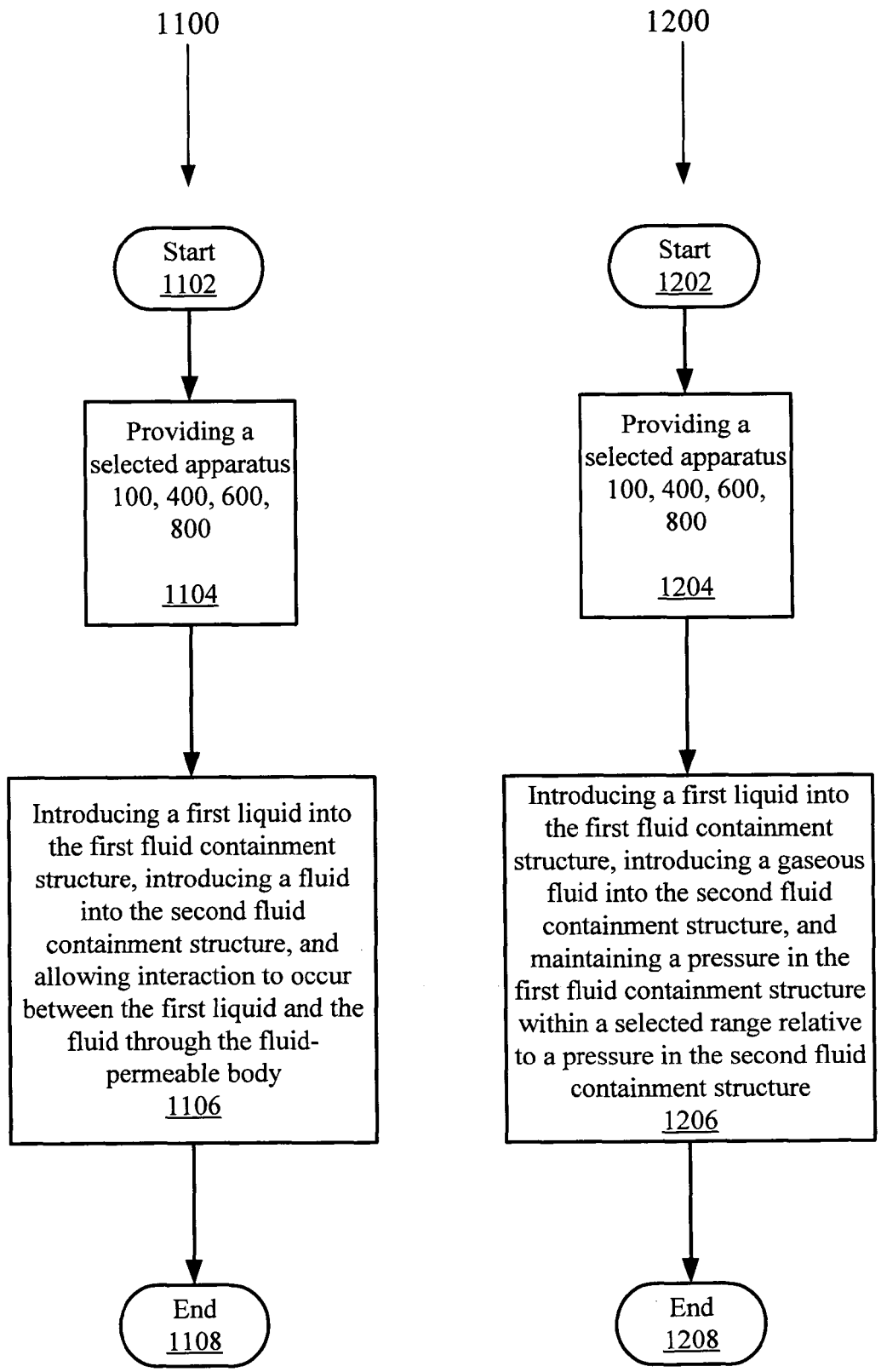

FLUID-PERMEABLE BODY HAVING A SUPERHYDROPHOBIC SURFACE

BACKGROUND OF THE INVENTION

1. Field of the Invention

This invention relates generally to structures having superhydrophobic surfaces, and processes for their fabrication.

2. Related Art

Hydrophobic structures are known for their ability to repel high surface tension liquids such as water. Some hydrophobic structures have been made that include a plurality of raised features that are spaced apart by interstices and held in positions relative to each other on a substrate. These raised features may take the form of various shapes, including posts, blades, spikes, and ridges. When a liquid having a sufficiently high surface tension makes contact with the surface of such a hydrophobic structure, the liquid may form an interface with the surface of the hydrophobic structure at a local contact angle sufficiently high so that the liquid does not immediately penetrate into the interstices. Such a surface is then described as being "superhydrophobic".

Despite these developments, superhydrophobic surfaces formed on raised features often require careful attention to maintaining a low pressure applied to the raised features by the liquid, to delay breakdown of the superhydrophobic repelling force and resultant penetration of the liquid through the surface and into the interstices between the raised features. The requirement of such a low pressure may prevent utilization of such superhydrophobic surfaces in environments where a fluid needs to flow over the surfaces, because such a flow may generate significant pressure on the surfaces. Moreover, superhydrophobic surface behavior has been explored for a limited scope of end use applications. Expansion of such end uses may facilitate new ways of handling liquids.

There accordingly is a continuing need for new types of superhydrophobic surface structures that make feasible the exploitation of superhydrophobic surface behavior.

SUMMARY

In an implementation of an example, an apparatus is provided, including: a rigid fluid-permeable body, having a first non-planar fluid-permeable body surface, and having a second fluid-permeable body surface; a plurality of fluid-permeable cells in the fluid-permeable body, each of a plurality of the fluid-permeable cells having a cell wall defining a fluid pathway communicating with openings in both the first and second fluid-permeable body surfaces; and a plurality of raised micro-scale features on the first fluid-permeable body surface.

As another implementation of an example, an apparatus is provided, including a fluid-permeable body having first and second fluid-permeable body surfaces; a plurality of fluid-permeable cells in the fluid-permeable body, each of a plurality of the fluid-permeable cells having a cell wall defining a fluid pathway communicating with openings in both the first and second fluid-permeable body surfaces; a plurality of raised micro-scale features on the first fluid-permeable body surface; and a fluid containment body forming, together with the second fluid-permeable body surface, a second fluid containment structure.

In a further implementation of an example, a method is provided of treating a liquid with a fluid, including: providing an apparatus including: a fluid-permeable body including a first fluid containment structure and having first and second fluid-permeable body surfaces; a plurality of fluid-permeable cells in the fluid-permeable body, each of a plurality of the fluid-permeable cells having a cell wall defining a fluid pathway communicating with openings in both the first and second fluid-permeable body surfaces; a plurality of raised micro-scale features on the first fluid-permeable body surface; and a fluid containment body forming, together with the second fluid-permeable body surface, a second fluid containment structure; and introducing a first liquid into the first fluid containment structure and introducing a fluid into the second fluid containment structure, whereby interaction is allowed to occur between the first liquid and the fluid through the fluid-permeable body.

As yet another implementation of an example, a method is provided of maintaining a superhydrophobic surface, including: providing an apparatus including: a fluid-permeable body including a first fluid containment structure and having first and second fluid-permeable body surfaces; a plurality of fluid-permeable cells in the fluid-permeable body, each of a plurality of the fluid-permeable cells having a cell wall defining a fluid pathway communicating with openings in both the first and second fluid-permeable body surfaces; a plurality of raised micro-scale features on the first fluid-permeable body surface; and a fluid containment body forming, together with the second fluid-permeable body surface, a second fluid containment structure; and introducing a liquid into the first fluid containment structure, introducing a gaseous fluid into the second fluid containment structure, and maintaining a pressure in the first fluid containment structure within a selected range relative to a pressure in the second fluid containment structure.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 11 is a flow chart showing an implementation of a method of treating a liquid with a fluid.

FIG. 12 is a flow chart showing an implementation of a method of maintaining a superhydrophobic surface.

DETAILED DESCRIPTION

Apparatus is provided, including: a fluid-permeable body having first and second fluid-permeable body surfaces; a plurality of fluid-permeable cells in the fluid-permeable body, each of a plurality of the fluid-permeable cells having a cell wall defining a fluid pathway communicating with openings in both the first and second fluid-permeable body surfaces; and a plurality of raised micro-scale features on the first fluid-permeable body surface. In an example, each of a plurality of raised micro-scale features may include an end, the ends forming a superhydrophobic surface, the raised micro-scale features spaced apart at a distance from the first fluid-permeable body surface. As another example, the fluid-permeable body may include a fluid-permeable conduit or a fluid-permeable cavity. In a further example, the apparatus may include a fluid containment body that forms, together with the second fluid-permeable body surface, a fluid containment structure.

Figure 1:
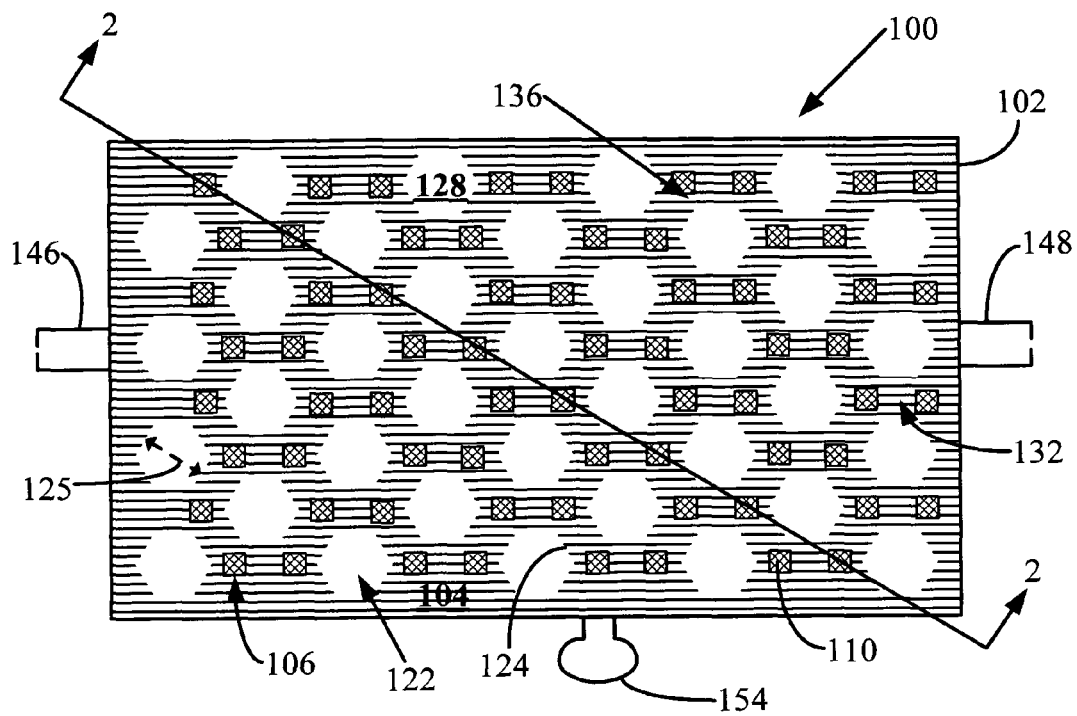
FIG. 1 is a top view showing an example of an apparatus including a fluid-permeable body having a first fluid-permeable body surface, and a plurality of raised micro-scale features on the first fluid-permeable body surface.
Figure 3:
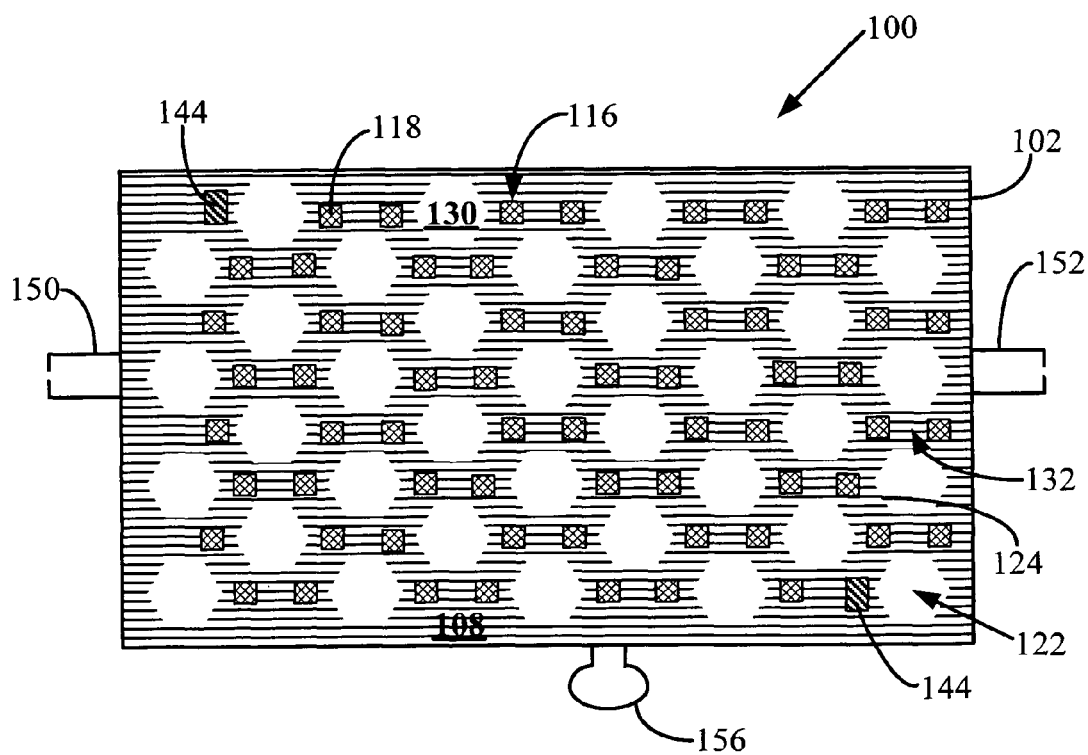
FIG. 3 is a cross-sectional bottom view taken on line 3-3, showing the apparatus of FIGS. 1 and 2.
Figure 2:
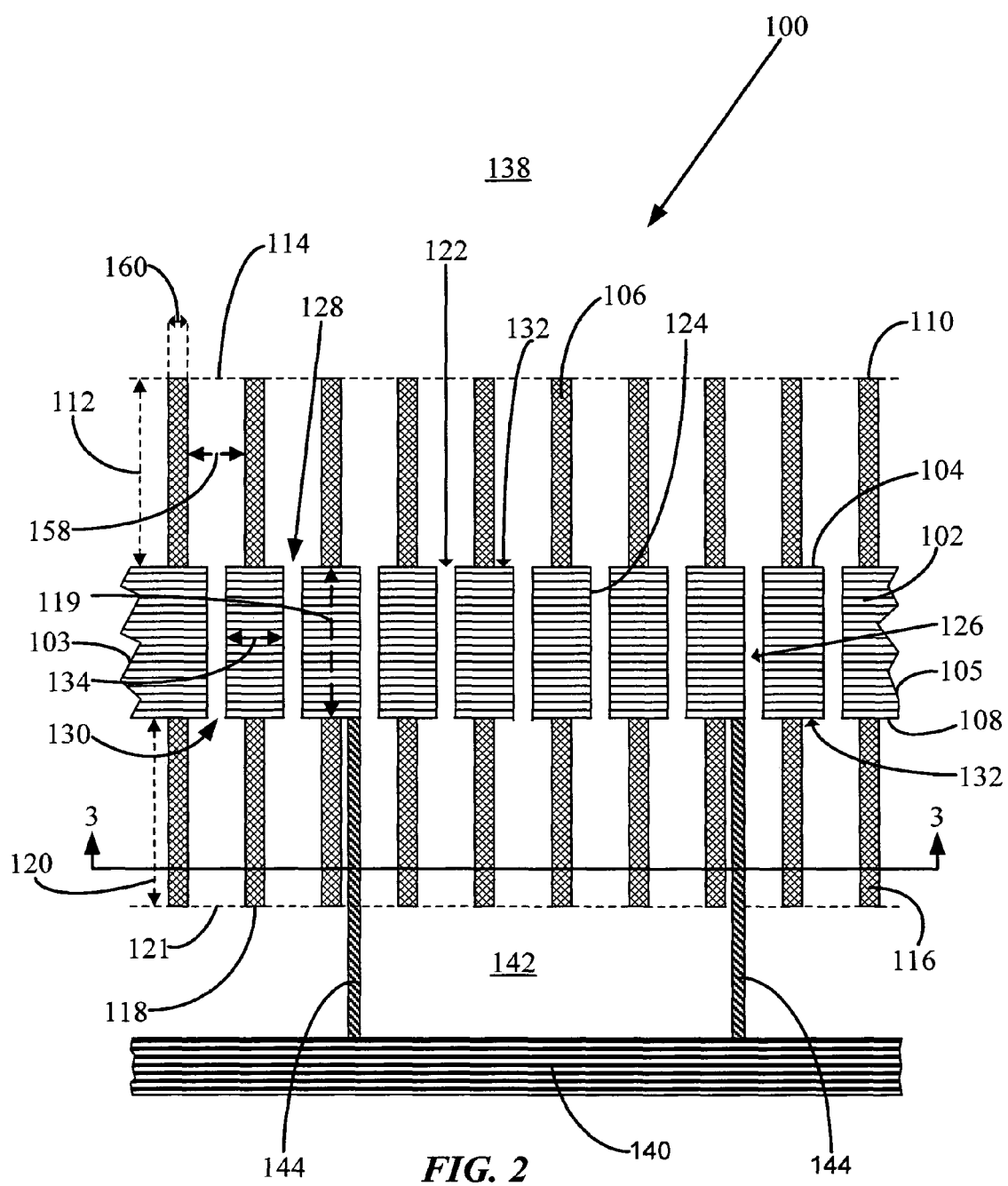
FIG. 2 is a partial cross-sectional side view taken on line 2-2, showing the apparatus of FIG. 1.

FIG. 1 is a top view showing an example of an apparatus 100, including a fluid-permeable body 102 having a first fluid-permeable body surface 104, and a plurality of raised micro-scale features 106 on the first fluid-permeable body surface 104. FIG. 2 is a partial cross-sectional side view taken on line 2-2, showing the apparatus 100 of FIG. 1. FIG. 3 is a cross-sectional bottom view taken on line 3-3, showing the apparatus 100 of FIGS. 1 and 2. The fluid-permeable body 102 includes a second fluid-permeable body surface 108 as shown in FIG. 2 in addition to the first fluid-permeable body surface 104 as shown in FIG. 1. FIG. 2 shows a partial view of the apparatus 100, as indicated by jagged ends 103, 105 of the fluid-permeable body 102.

In an example, each of a plurality of the raised micro-scale features 106 may include an end 110, the ends 110 being spaced apart at a distance 112 from the first fluid-permeable body surface 104, the ends 110 forming a superhydrophobic surface 114. As another example, the apparatus 100 may include a plurality of raised micro-scale features 116 on the second fluid-permeable body surface 108. In a further example, each of a plurality of the raised micro-scale features 116 may include an end 118, the ends 118 being spaced apart at a distance 120 from the second fluid-permeable body surface 108, the ends 118 forming a superhydrophobic surface 121. A plurality of raised micro-scale features 106 may be, as an example, monolithic with the fluid-permeable body 102. Likewise, a plurality of raised micro-scale features 116 may be, as an example, monolithic with the fluid-permeable body 102. Throughout this specification, the term "monolithic" means that the apparatus elements so described, such as the raised micro-scale features 106, 116 and the fluid-permeable body 102, are a single, unitary body of the same material. It is understood that an apparatus 100 may likewise be assembled from a plurality of monolithic sections (not shown).

The fluid-permeable body 102 includes a plurality of fluid-permeable cells 122. Each of a plurality of the fluid-permeable cells 122 includes a cell wall 124 defining a fluid pathway 126 communicating with openings 128, 130 respectively in the first fluid-permeable body surface 104 and the second fluid-permeable body surface 108. As an example, a plurality of the fluid pathways 126 may be sufficiently large so that a fluid may permeate between the first fluid-permeable body surface 104 and the second fluid-permeable body surface 108, rather than merely passing by diffusion between the first and second fluid-permeable body surfaces 104, 108. In an example, a cross-section 125 of a fluid pathway 126 may have an average diameter within a range of between about 0.1 millimeter and about 50 millimeters. As another example, a cross-section 125 of a fluid pathway 126 may have an average diameter within a range of between about 5 millimeters and about 10 millimeters. In an additional example, a cross-section 125 of a fluid pathway 126 may have an average diameter within a range of between about 0.5 millimeter and about 3 millimeters.

In an example, the fluid-permeable body 102 may have a thickness 119 between the first and second fluid-permeable body surfaces 104 and 108 within a range of between about 0.1 millimeter and about 50 millimeters. As another example, the fluid-permeable body 102 may have a thickness 119 between the first and second fluid-permeable body surfaces 104 and 108 of about 1 millimeter.

The term "fluid" as used throughout this specification means and includes matter in a state that is capable of flowing. A "fluid" may include, as examples, a gas, a liquid, or a gas and a liquid; and may additionally include a solid provided that the "fluid" is capable of flowing.

As an example where the fluid includes a liquid, the superhydrophobic surface 114 may prevent the liquid, at a selected fluid pressure applied to ends 110 of the raised micro-scale features 106, from immediately penetrating the superhydrophobic surface 114. In an example, the fluid-permeable body 102 may include a plurality of fluid-permeable cells 122 each having a single first fluid-permeable body surface opening 128 in communication with the first fluid-permeable body surface 104, and having a single second fluid-permeable body surface opening 130 in communication with the second fluid-permeable body surface 108. In a further example (not shown), a plurality of fluid pathways 126, or each fluid pathway 126, may indirectly connect together openings 128, 130 in the first and second fluid-permeable body surfaces 104, 108. As an example (not shown) an opening 128 may communicate through a fluid pathway 126 to more than one opening 130, or an opening 130 may communicate through a fluid pathway 126 to more than one opening 128. The fluid pathways 126 between the openings 128 in the first fluid-permeable body surface 104 and the openings 130 in the second fluid-permeable body surface 108 may, as an example, be straight as shown in FIG. 2. In another example (not shown), the fluid-permeable body 102 may include fluid pathways 126 that are not straight. As examples, the fluid-permeable body 102 may include fluid pathways 126 that are curved, branched, or which pass between the first and second fluid-permeable body surfaces 104 and 108 at one or more angles that are perpendicular to or not perpendicular to a plane (not shown) of such surfaces adjacent to the openings 128, 130 with which the fluid pathways 126 communicate.

In an example, a plurality of cell walls 124 in the fluid-permeable body 102 may each include a ridge 132 forming part of the first fluid-permeable body surface 104 or forming part of the second fluid-permeable body surface 108. As another example, the apparatus 100 may include a plurality of raised micro-scale features 106 each positioned on a ridge 132.

As examples, the openings 128 in the first fluid-permeable body surface 104 may have selected opening shapes, and may be positioned with respect to each other in a first array in the first fluid-permeable body surface 104. FIG. 1 shows an example of a first array of fluid-permeable cells 122 having cell walls 124 forming first fluid-permeable body surface openings 128 having hexagonal shapes, the openings 128 being arranged in a honeycomb first array in the first fluid-permeable body surface 104. As another example, the cell walls 124 may have a selected thickness 134 between adjacent fluid-permeable cells 122, and a plurality of first fluid-permeable body surface openings 128 may be separated in the first fluid-permeable body surface 104 only by cell walls 124 having the selected thickness 134, in order to maximize a density of such openings 128 in the first fluid-permeable body surface 104. In an example, the selected thickness 134 of the cell walls 124 may be about 1 millimeter. As examples, the selected thickness 134 of the cell walls 124 may be within a range of between about 0.05 millimeter and about 5 millimeters. In further examples (not shown), the openings 128 in the first fluid-permeable body surface 104 may form a first array that is different from that shown in FIG. 1. As examples, other shapes of first fluid-permeable body surface openings 128 may be utilized. In examples, one or more of the following shapes of first fluid-permeable body surface openings 128 may be selected: triangular, square, rectangular, pentagonal, trapezoidal, heptagonal, polygonal, circular, elliptical, and irregular. As further examples, shapes of first fluid-permeable body surface openings 128 may be selected to include: more than one size or graduated sizes of a selected shape or shapes, or different selected shapes for inclusion at different selected locations or regions in the first fluid-permeable body surface 104. As additional examples, the openings 130 in the second fluid-permeable body surface 108 may have shapes selected in the same manner, and may be positioned in an array in the second fluid-permeable body surface 108 selected in the same manner as discussed with respect to the openings 128. FIG. 3 shows an example of a first array of fluid-permeable cells 122 having cell walls 124 forming second fluid-permeable body surface openings 130 having hexagonal shapes, the openings 130 being arranged in the same honeycomb first array as may be selected for the first array shown in FIG. 1 for the first fluid-permeable body surface 104. In another example (not shown), a first array of fluid-permeable cells 122 having cell walls 124 forming first and second fluid-permeable body surface openings 128, 130 having square shapes (not shown), may include openings 128, 130 arranged in a square mesh first array.

As an example, the apparatus 100 may include a plurality of raised micro-scale features 106 that are positioned in a second array on the first fluid-permeable body surface 104, the second array being different than the first array. FIG. 1 shows an example of a second array including a plurality of raised micro-scale features 106 positioned on ridges 132 of cell walls 124 of fluid-permeable cells 122, the raised micro-scale features 106 arranged in a first array in the first fluid-permeable body surface 104. In an example, a plurality of raised micro-scale features 106 may be positioned at vertices 136 between fluid-permeable cells 122 as defined by cell walls 124. In the example shown in FIG. 1, a plurality of raised micro-scale features 106 may be placed at vertices 136 between fluid-permeable cells 122 that have hexagonal shapes and that are arranged in a first array in the first fluid-permeable body surface 104 as discussed above. Accordingly, the raised micro-scale features 106 may, as shown in FIG. 1, be arranged in a second array on the first fluid-permeable body surface 104 that is different than the first array. In this manner, as an example, the raised micro-scale features 106 and the first fluid-permeable body surface openings 128 may be positioned in such second and first arrays on the first fluid-permeable body surface 104 without mutual interference.

In an example, the first fluid-permeable body surface 104 and the second fluid-permeable body surface 108 may both include planar surfaces. Throughout this specification the term "planar" means that the surface described is generally or substantially planar but may not necessarily be completely planar. As another example, the first and second fluid-permeable body surfaces 104 and 108 may be co-planar. In further examples, the first and second fluid-permeable body surfaces 104 and 108 may both be non-planar, or may each be planar but not co-planar. In an example (not shown), the first fluid-permeable body surface 104 may include a non-planar surface such as a semi-cylindrical or cylindrical surface. As another example, the fluid-permeable body 102 may be have a rigid structure suitable for maintaining its shape. In a further example, the first fluid-permeable body surface 104 may include a rigid non-planar surface such as a semi-cylindrical or cylindrical surface. As examples, a portion or all of the fluid-permeable body 102 may form a first fluid containment structure 138. In examples discussed further below, the fluid-permeable body 102 may form a first fluid containment structure 138 including a conduit or a cavity. Throughout this specification, the term "conduit" means a structure including an interior region that is capable of being utilized to convey a fluid from one point to another. Throughout this specification, the term "cavity" means a structure including a hollow interior region. As an example, the first fluid-permeable body surface 104 may form an interior region of a conduit or an interior region of a cavity. In another example, a portion or all of the fluid-permeable body 102 may form a tubular first fluid containment structure 138, such as a tubular conduit or a tubular cavity. As examples, such a tubular first fluid containment structure 138 may have a tubular cross-section of a conduit as defined transversely to a direction of conveying a fluid, or a tubular cross-section as defined transversely to a direction of exit from a cavity, that is circular, elliptical, square, rectangular, polygonal, or irregular.

In an example, the apparatus 100 may include a fluid containment body 140. As another example, the fluid containment body 140 may, together with the second fluid-permeable body surface 108, form a second fluid containment structure 142. In an example where the second fluid-permeable body surface 108 is planar, the second fluid containment structure 142 may occupy a space generally having a rectangular prismatic or cubic shape. In examples where the fluid-permeable body 102 may form a tubular first fluid containment structure 138, such as a tubular conduit or a tubular cavity, the second fluid containment structure 142 may occupy a space surrounding the tubular first fluid containment structure 138 and generally having an annular shape. As another example, the apparatus 100 may include a support member 144 connecting the fluid-permeable body 102 with the fluid containment body 140. The support member 144 may, as an example, maintain the fluid-permeable body 102 in a selected position with respect to the fluid containment body 140. In an example (not shown) the apparatus 100 may include a plurality of support members 144 connecting the fluid-permeable body 102 with the fluid containment body 140.

As an example, the apparatus 100 may include a first fluid containment structure 138 and a second fluid containment structure 142, and the second fluid containment structure 142 may be selected to be a fluid pressure containment chamber. In another example, either or both of the first and second fluid containment structures 138 and 142 may include one or a plurality of fittings for input and output of fluids. As an example, the first fluid containment structure 138 may include a fitting 146 for input of a fluid and a fitting 148 for output of a fluid. In a further example, the second fluid containment structure 142 may include a fitting 150 for input of a fluid and a fitting 152 for output of a fluid. The fittings 146-152 may include, as examples, openings or valves. In another example, either or both of the first and second fluid containment structures 138 and 142 may include one or a plurality of fluid pressure gauges 154 and 156, respectively. In examples, any or all of the elements of an apparatus 100 shown in the figures and discussed in this specification may be rigid, and may be capable of maintaining their shapes in utilization of the apparatus 100. In operation, as an example, of an apparatus 100 including first and second fluid containment structures 138 and 142 and in which the second fluid containment structure 142 is selected to be a fluid pressure containment chamber, a fluid pressure within the second fluid containment structure 142 may enable an increased fluid pressure to be utilized within the first fluid containment structure 138. The fluid pressure within the first fluid containment structure 138 may include, as an example, pressure resulting from a flow of a fluid into or through the first fluid containment structure 138. In another example (not shown), an apparatus 100 may include conduits for conveying fluids within, into and out of the apparatus 100. As a further example (not shown), an apparatus 100 may include perimeter walls and additional support members for maintaining the structural and operational integrity of the apparatus 100.

As an example where a fluid in the first fluid containment structure 138 includes a liquid, a gradually increasing fluid pressure within the first fluid containment structure 138 may eventually cause a breakdown in the superhydrophobic surface 114. After occurrence of such a breakdown in the superhydrophobic surface 114, the liquid may penetrate from the first fluid containment structure 138 through fluid-permeable cells 122 into the second fluid containment structure 142. In an example where the second fluid containment structure 142 is selected to be a fluid pressure containment chamber, a fluid pressure within the second fluid containment structure 142 may be upwardly adjusted by controlling input and output of fluid through the fittings 150, 152 and monitoring the pressure with fluid pressure gauge 156, to counteract the fluid pressure of a liquid within the first fluid containment structure 138. As an example, by balancing the fluid pressures within the first and second fluid containment structures 138 and 142, the superhydrophobic surface 114 may be maintained despite an elevated fluid pressure of a liquid within the first fluid containment structure 138.

In an example, a maximum fluid pressure that can be supported by a superhydrophobic surface 114 collectively formed by ends 110 of raised micro-scale features 106 may be increased, by reducing an end-to-end separation distance 158 or "pitch" of the raised micro scale features 106. As another example, a 3D printing process, discussed later, may be utilized in fabricating an apparatus 100. In that case, in a further example, a relatively higher resolution may be selected in the 3D printing process to so reduce the separation 158 between the ends 110 of the raised micro-scale features 106. As an example (not shown), such reductions might facilitate omission of the raised micro-scale features 106, 116 and utilization of the first and second fluid-permeable body surfaces 104, 108 as superhydrophobic surfaces.

As an example, a maximum liquid pressure that can be supported by a superhydrophobic surface 114 having an underlying structure including air, in general, may be described by the following equation, $$b > \frac{1 - \sin(\theta_A - \alpha)}{\sqrt{2} \; |\cos(\theta_A - \alpha)|} d,$$

$$d < 2\sqrt{2} \, \sigma \frac{|\cos(\theta_A - \alpha)|}{\Delta P}$$

where b is the height 112 of the raised micro-scale features 106, d is the distance 158 between the ends 110 of the raised micro-scale features 106, and $\Delta P$=the pressure of liquid $P_l$ over the pressure of the air, expressed in MegaPascals ("MPa"). Further, $\theta_A$ in the equation is the advancing contact angle between the liquid and the ends 110 of the raised micro-scale features 106. In addition, $\alpha$ in the equation is the average angle by which lateral surfaces of the raised micro-scale features 106, between the first fluid-permeable body surface 104 and the ends 110, deviate from a line perpendicular to the first fluid-permeable body surface 104. Also, in the equation, $\sigma$ is the surface tension of the liquid-air interface. As an example, if the liquid is water, then $\sigma$=0.0727 Newtons per meter (N/m) at 20 degrees Centigrade ("° C."), $\Delta P$ is 0.1 MPa at about one atmosphere, and $(\theta_A - \alpha)$ is 120°. Accordingly, the pitch distance d (158) should be less than about one micrometer, and the raised micro-scale feature (106) height b (112) should be larger than about 0.4 micrometer. As another example, the equation above also generally shows that the maximum liquid pressure that can be supported by a superhydrophobic surface 114 is inversely proportional to the diameters 160 of the raised micro-scale features 106. The above formula is disclosed in Choi and Kim, "Large Slip of Aqueous Liquid Flow Over a Nanoengineered Superhydrophobic Surface", Physical Review Letters, Vol. 96, pp. 066001-1-066001-4 (American Physical Society Feb. 17, 2006), the entirety of which hereby is incorporated herein by reference.

As another general example, a superhydrophobic surface 114 formed on ends 110 of raised micro-scale features 106 supported by a solid body surface (not shown) not including fluid-permeable cells, may generally be capable of supporting a liquid pressure of up to about 0.0005 MPa, equivalent to about 0.07 pounds per square inch ("psi") at a 200 micron end-to-end distance 158 or "pitch". In another example (not shown), raised micro-scale features 106, supported by such a solid body surface, may be selected having a pyramid shape with the pyramid bases on the solid body surface. In that example, the superhydrophobic surface 114 may be capable of supporting a maximum liquid pressure relatively increased by about 50-100%. In a further example, if a superhydrophobic surface 114 could be formed on ends of raised micro-scale features 106 supported by a solid body surface not including fluid-permeable cells and having a 2 micron end-to-end distance 158 or "pitch", then the superhydrophobic surface 114 would theoretically be capable of supporting a liquid pressure of up to about 0.05 MPa, equivalent to about 7.4 psi".

In another example, the above equation illustrates that for a given diameter 160 of raised micro-scale features 106, a maximum liquid pressure sustainable by the superhydrophobic surface 114 may be increased if the air pressure below the superhydrophobic surface 114 is also increased such that $\Delta P$ across the body surface supporting the raised micro-scale features 106 remains constant.

As an example, an enclosed space for containing the air below the superhydrophobic surface 114 may be provided so that the air may be maintained under a selected pressure, which may in an example be elevated. In an example, the air pressure may be controlled to be lower than the pressure of the liquid on the superhydrophobic surface 114, to avoid introducing air bubbles into the liquid or otherwise creating an unstable liquid/air interface. As another example, the air pressure may be controlled to be greater than the value dictated for $\Delta P$ in the equation above, so that the superhydrophobic surface 114 may remain intact. As an additional example, the air pressure within the second fluid containment structure 142 may be increased to any selected value, including a high pressure, permitting the liquid pressure within the first fluid containment structure 138 to be maintained at a corresponding high pressure. In a further example, the raised microscale features 106 may additionally be selected to have a relatively small end-to-end distance 158, which may allow a correspondingly greater maximum $\Delta P$, resulting in a larger $\Delta P$ operating window within which the superhydrophobic surface 114 may be maintained. As yet another example, control of the air pressure at selected values within the $\Delta P$ operating window may reduce or eliminate formation of gas bubbles within the first fluid containment structure 138, or facilitate their passage through fluid pathways 126 to the second fluid containment structure 142 for removal or further processing. Such gas bubbles, as an example, might form within the first fluid containment structure 138 and become attached to the first fluid-permeable body surface 104. Gas bubbles attached to the first fluid-permeable body surface 104 may, as examples, create an obstacle to fluid flow, and contribute to a pressure drop of a fluid flow within the first fluid containment structure 138.

In an example, an apparatus 100 equipped with a first fluid containment structure 138 including a conduit, and a second fluid containment structure 142 so selected to be a fluid pressure containment chamber, may facilitate a flow of a fluid including a liquid through the conduit at an elevated pressure while maintaining the superhydrophobic surface 114. Such an elevated pressure may occur, as an example, during a high throughput flow of the fluid including a liquid or during flow of a high viscosity fluid including a liquid through the conduit included in the first fluid containment structure 138. It is understood that the apparatus 100 may include raised microscale features 106, or 116, or both 106 and 116. In an example, a fluid for introduction into the first fluid containment structure 138 and a fluid for introduction into the second fluid containment structure 142 may be independently selected.

As another example, the fluid for introduction into the first fluid containment structure 138 may include a liquid, and the fluid for introduction into the second fluid containment structure 142 may include a gas or a liquid. In an example, an entire surface periphery (not shown) of the liquid except for surface periphery portions in contact with ends 110 of raised microscale features 106, may be placed, through the fluid-permeable body 102, in close proximity with the fluid within the second fluid containment structure 142. Where the fluid for introduction into the first fluid containment structure 138 includes a liquid and the fluid for introduction into the second fluid containment structure 142 includes a gas, the apparatus 100 may be utilized to maintain a fluid flow of the liquid within the first fluid containment structure 138 at an elevated pressure without compromising the superhydrophobic surface 114, by counteracting the elevated pressure of the liquid by a selected pressure of the gas. As a further example, the selected pressure of the gas may facilitate migration, flow, diffusion or dissolution of the gas into the liquid, or reaction of the gas with the liquid. Where the fluid for introduction into the first fluid containment structure 138 includes a liquid and the fluid for introduction into the second fluid containment structure 142 also includes a liquid, the apparatus 100 may be utilized to facilitate interaction between the liquids in the first and second fluid containment structures 138 and 142. As an example, molecules in the liquid in the first fluid containment structure 138 or in the liquid in the second fluid containment structure 142 may migrate, flow or diffuse to and interact with the liquid in the second fluid containment structure 142 or the liquid in the first fluid containment structure 138, respectively. In examples, such migration, flow or diffusion may as an example be caused by a vapor pressure of a liquid. In a further example, a superhydrophobic surface 114, 121 may become compromised and then allow direct interaction between the liquids, such as their reaction or mixing. Such a compromise of a superhydrophobic surface 114, 121 may be caused, as examples, by external application or internal occurrence of an elevated pressure or another condition unsupportable by the superhydrophobic surface 114, 121.

As an example, the apparatus 100 may be utilized to oxygenate blood by introducing a fluid including blood into the first fluid containment structure 138 and introducing a fluid containing oxygen into the second fluid containment structure 142, so that oxygen may be delivered to the blood and carbon dioxide may be removed from the blood. In another example, the apparatus 100 may be utilized in chemical manufacturing by introducing a fluid including a liquid into the first fluid containment structure 138 and introducing a fluid for reaction with the liquid into the second fluid containment structure 142, so that a reaction occurs across the fluid-permeable body 102 or at the superhydrophobic surface 114. In that case, the fluids for reaction may make mutual contact at an increased rate, and may be caused to flow within the first and second fluid containment structures 138, 142 at increased rates, which may facilitate an increased reaction rate. As a further example, the apparatus 100 may be utilized to facilitate an elevated rate of flow of a liquid in the first fluid containment structure 138, such as a flow of blood within a medical treatment apparatus. In another example, the apparatus 100 may be utilized to facilitate removal of a gas or vapor from a liquid in the first fluid containment structure 138, such as drying a solid dissolved in a liquid solvent, by removing the solvent. As an additional example, the apparatus 100 may be utilized in dialysis of a liquid such as blood, by allowing a liquid flowing within the first fluid containment structure 138 to interact with a fluid flowing within the second fluid containment structure 142. In that case, in an example, an apparatus 100 may be selected including both superhydrophobic surfaces 114 and 121, then a liquid may be caused to flow within the second fluid containment structure 142. As a further example, the apparatus 100 may be utilized in a fuel cell, by allowing a vapor carrying molecules from a liquid flowing within the first fluid containment structure 138 to contact a fluid flowing within the second fluid containment structure 142.

The average diameter 160 of the raised micro-scale features 106, 116 respectively measured at the first and second fluid-permeable body surfaces 104 and 108 is less than about 1,000 micrometers (referred to throughout this specification as "micro-scale"). As an example, the average diameter 160 of the raised micro-scale features 106, 116 respectively measured at the first and second fluid-permeable body surfaces 104 and 108 may be less than about 400 micrometers. In an example, the average diameter 160 of the raised micro-scale features 106, 116 respectively measured at the first and second fluid-permeable body surfaces 104 and 108 may be greater than about 50 micrometers. Raised micro-scale features 106, 116 having relatively small average diameter 160s may generate relatively low resistance to flow of a fluid over the raised micro-scale features. As another example, the raised micro-scale features 106, 116 may have diameters of about 0.24 millimeter at the first and second fluid-permeable body surfaces 104 and 108, and diameters of about 0.15 millimeter at the ends 110, 118.

In an example, the average length 112, 120 of the raised micro-scale features 106, 116 may be less than about 10 millimeters ("mm") on and respectively extending away from the first and second fluid-permeable body surfaces 104 and 108. In a further example, the average length 112, 120 of the raised micro-scale features 106, 116 may be less than about 2 mm on and respectively extending away from the first and second fluid-permeable body surfaces 104 and 108. As an additional example, the average length 112, 120 of the raised micro-scale features 106, 116 may be greater than about 10 mm on and respectively extending away from the first and second fluid-permeable body surfaces 104 and 108. In another example, the average length 112, 120 of the raised micro-scale features 106, 116 may be greater than about 16 micrometers, on and respectively extending away from the first and second fluid-permeable body surfaces 104 and 108. As another example, the average length 112, 120 of the raised micro-scale features 106, 116 may be within a range of between about 1,000 micrometers and about 2,000 micrometers on and respectively extending away from the first and second fluid-permeable body surfaces 104 and 108. As a further example, the average length 112, 120 of the raised micro-scale features 106, 116 may be within a range of between about 600 micrometers and about 700 micrometers on and respectively extending away from the first and second fluid-permeable body surfaces 104 and 108.

In an example, the first fluid-permeable body surface 104 may be substantially covered by the superhydrophobic surface 114 formed by ends 110 of the raised micro-scale features 106. In another example, the second fluid-permeable body surface 108 may be substantially covered by the superhydrophobic surface 121 formed by ends 118 of the raised micro-scale features 116. By "substantially covered" is meant that the raised micro-scale-features 106, 116 are spaced apart on the first and second fluid-permeable body surfaces 104 and 108 respectively with sufficient density so that the ends 110 and 118 of the raised micro-scale features 106, 116 collectively exhibit superhydrophobic behavior. The term "superhydrophobic" as used throughout this specification means that the subject pattern of raised micro-scale features 106, 116 is not immediately wetted by a liquid having a surface tension greater than about 70 dynes per centimeter ("d/cm"), and may not be immediately wetted by a liquid having a surface tension greater than about 28 d/cm. As an example, an alcohol having a surface tension of about 28 d/cm may not immediately wet a superhydrophobic pattern of raised micro-scale features as disclosed in this specification.

As an example, the raised micro-scale features 106, 116 may be arranged in a pattern on the first and second fluid-permeable body surfaces 104 and 108 respectively so that an average spacing ("pitch") between nearest adjacent raised micro-scale features 106, 116 is within a range of between about 1 micrometer and about 1 mm. In another example, the raised micro-scale features 106, 116 may be arranged in a pattern on the first and second fluid-permeable body surfaces 104 and 108 so that an average pitch between nearest adjacent raised micro-scale features 106, 116 is within a range of between about 0.2 mm and about 0.6 mm. In a further example, the raised micro-scale features 106, 116 may be randomly spaced apart, uniformly spaced apart, or spaced apart in a defined pattern or gradient on the first and second fluid-permeable body surfaces 104, 108.

As an additional example, the raised micro-scale features 106, 116 may be arranged in hexagonal unit cell patterns on the first and second fluid-permeable body surfaces 104 and 108 respectively. In an example, a maximum pitch between the outer surfaces of raised micro-scale features 106, 116 in a hexagonal unit cell may be about 0.4 millimeter, and a minimum pitch between inner surfaces of the same raised micro-scale features 106, 116 in the unit cell may be about 0.2 millimeter.

The raised micro-scale features 106, 116 may have any selected cross-sectional shape or shapes, such a cross-section being defined as a section through a raised micro-scale feature 106, 116 in a direction generally transverse to a portion of the first or second fluid-permeable body surface 104, 108. As examples, such cross-sectional shapes may include, singly or in combination, posts, blades, spikes, pyramids, square rectangles, nails, and ridges. Suitable cross-sectional shapes are shown, as examples, in FIGS. 1A-E and 3A-C of U.S. patent application Ser. No. 10/806,543, entitled "Dynamically Controllable Biological/Chemical Detectors Having Nanostructured Surfaces", issued on May 23, 2006 as U.S. Pat. No. 7,048,889, the entirety of which is hereby incorporated herein by reference. Further suitable cross-sectional shapes are disclosed in U.S. patent application Ser. No. 11/387,518, entitled "Super-Phobic Surface Structures", filed on Mar. 23, 2006, the entirety of which is hereby incorporated herein by reference.

In addition to forming a superhydrophobic surface 114, 121, the raised micro-scale features 106, 116 may also collectively function as a thermal insulator. In an example, the raised micro-scale features 106, 116 may have cross-sectional shapes that vary in size along the lengths 112, 120 of the raised micro-scale features 106, 116. As an example, such variable cross-sectional shapes may define void space between adjacent raised micro-scale features 106, 116. This void space may increase the effectiveness of the superhydrophobic surface formed by the raised micro-scale features 106, 116 to function as a thermal insulator.

In an example, the raised micro-scale features 106, 116 may have square pyramid shapes with average square dimensions of about 200 micrometers×200 micrometers measured at the first or second fluid-permeable body surface 104, 108, the raised micro-scale features 106, 116 being on and extending away from the first and second fluid-permeable body surfaces 104, 108 by an average length 112, 120 of about 2000 micrometers, at a pitch of about 200 micrometers. In another example, the raised micro-scale features 106, 116 may have square rectangle shapes with average dimensions of about 200 micrometers×200 micrometers measured at the first or second fluid-permeable body surface 104, 108, the raised micro-scale features 106, 116 being on and extending away from the first or second fluid-permeable body surface 104, 108 by an average length 112, 120 of about 1500 micrometers, at a pitch of about 600 micrometers. As a further example, the raised micro-scale features 106, 116 may have square rectangle shapes with average dimensions of about 200 micrometers×200 micrometers measured at the first or second fluid-permeable body surface 104, 108, the raised micro-scale features 106, 116 being on and extending away from the first or second fluid-permeable body surface 104, 108 by an average length 112, 120 of about 1000 micrometers, at a pitch of about 600 micrometers. In an additional example, the raised micro-scale features 106, 116 may have square rectangle shapes with average dimensions of about 200 micrometers×200 micrometers measured at the first or second fluid-permeable body surface 104, 108, the raised micro-scale features 106, 116 being on and extending away from the first or second fluid-permeable body surface 104, 108 by an average length 112, 120 of about 1500 micrometers, at a pitch of about 500 micrometers. As a further example, the raised micro-scale features 106, 116 may have square rectangle shapes with average dimensions of about 200 micrometers×200 micrometers measured at the first or second fluid-permeable body surface 104, 108, the raised micro-scale features 106, 116 being on and extending away from the first or second fluid-permeable body surface 104, 108 by an average length 112, 120 of about 1000 micrometers, at a pitch of about 500 micrometers. In another example, the raised micro-scale features 106, 116 may have square rectangle shapes with average dimensions of about 200 micrometers×200 micrometers measured at the first or second fluid-permeable body surface 104, 108, the raised micro-scale features 106, 116 being on and extending away from the first or second fluid-permeable body surface 104, 108 by an average length 112, 120 of about 1000 micrometers, at a pitch of about 400 micrometers. As a further example, the raised micro-scale features 106, 116 may have nail shapes with average dimensions of about 100 micrometers×200 micrometers measured at the first or second fluid-permeable body surface 104, 108, the raised micro-scale features 106, 116 being on and extending away from the first or second fluid-permeable body surface 104, 108 by an average length 112, 120 of about 1000 micrometers, at a pitch of about 400 micrometers.

Materials for forming the apparatus 100 may include precursor reagents yielding a selected polymer suitable for forming a mechanically strong solid body. In an example, precursors for a polymer material may be selected depending in part upon the relative flexibility or rigidity of the resulting polymer. As examples, the apparatus 100 may include rigid or flexible polymers depending upon a selected end-use application for the apparatus 100. In another example, precursors for a biocompatible polymer may be selected. As an example, polyethylene is biocompatible. In the case of rapid prototype laydown processes (discussed below) employing materials applied in a solid state, polymer particles having a narrow particle size distribution may as an example be selected. In another example, polymer particles may be selected having a relatively small average particle size, so that raised micro-scale features 106, 116 having relatively small dimensions may be fabricated. Where an ink-jet process or other fluid spraying process is selected for lay-down of material forming the apparatus 100, as discussed further below, the reagents may be provided in a fluid form such as a liquid.

Materials for forming the apparatus 100 may include monomers, oligomers, pre-polymers and polymers, as well as curing agents and other polymerization additives. Suitable polymers to be used or formed may include: polyolefins such as polyethylene, polypropylene and copolymers; acrylic polymers; acrylonitrile-butadiene-styrene ("ABS") polymers; polycarbonates ("PC"); PC-ABS; methyl methacrylates; methyl methacrylate—ABS copolymers ("ABSi"); polyphenylsulfones; polyamides; and fluoropolymers such as fluorinated ethylene propylene copolymers and Teflon® fluorinated hydrocarbon polymers. As an example, a polymer having a minimal concentration of active hydrophilic moieties may be selected. Additives may be selected to increase the overall flexibility of the apparatus 100. In an example, molecules that are compatible with a selected polymer but having relatively low molecular weights may be used as flexibilizing additives. For polyethylene polymers, low molecular weight linear hydrocarbon waxes, as an example, may be used as flexibilizing additives. In another example, halogenated hydrocarbons, such as perfluorinated hydrocarbon waxes, may be used as such additives. In another example, ultraviolet-cured polymers such as acrylic, urethane acrylate, vinyl ether, epoxy acrylate, epoxy and vinyl chloride polymers may be used. Suitable polymer compositions may include rapid prototyping polymers commercially available from Stratasys Inc., 14950 Martin Dr., Eden Prairie, Minn. 55344, and from Redeye RPM, 8081 Wallace Rd., Eden Prairie, Minn. 55344. As an example, VisiJet® HR-200 Plastic Material, commercially available from 3-D Systems, Inc., may be utilized as the build material. VisiJet® HR-200 Plastic Material includes triethylene glycol dimethacrylate ester, urethane acrylate polymer, and propylene glycol monomethacrylate. As another example, materials for forming the apparatus 100 may include ceramics, such as ceramic powders.

The preceding discussion regarding the diameters, lengths, pitch, and shapes of raised micro-scale features 106, 116, regarding the formation of superhydrophobic surfaces 114, 121 and their utilization as thermal insulators, and regarding materials for making the apparatus 100, applies likewise to all other raised micro-scale features and all other apparatus including superhydrophobic surfaces disclosed elsewhere in this specification, including the apparatus 400, 600, and 800 discussed below.

Figure 4:
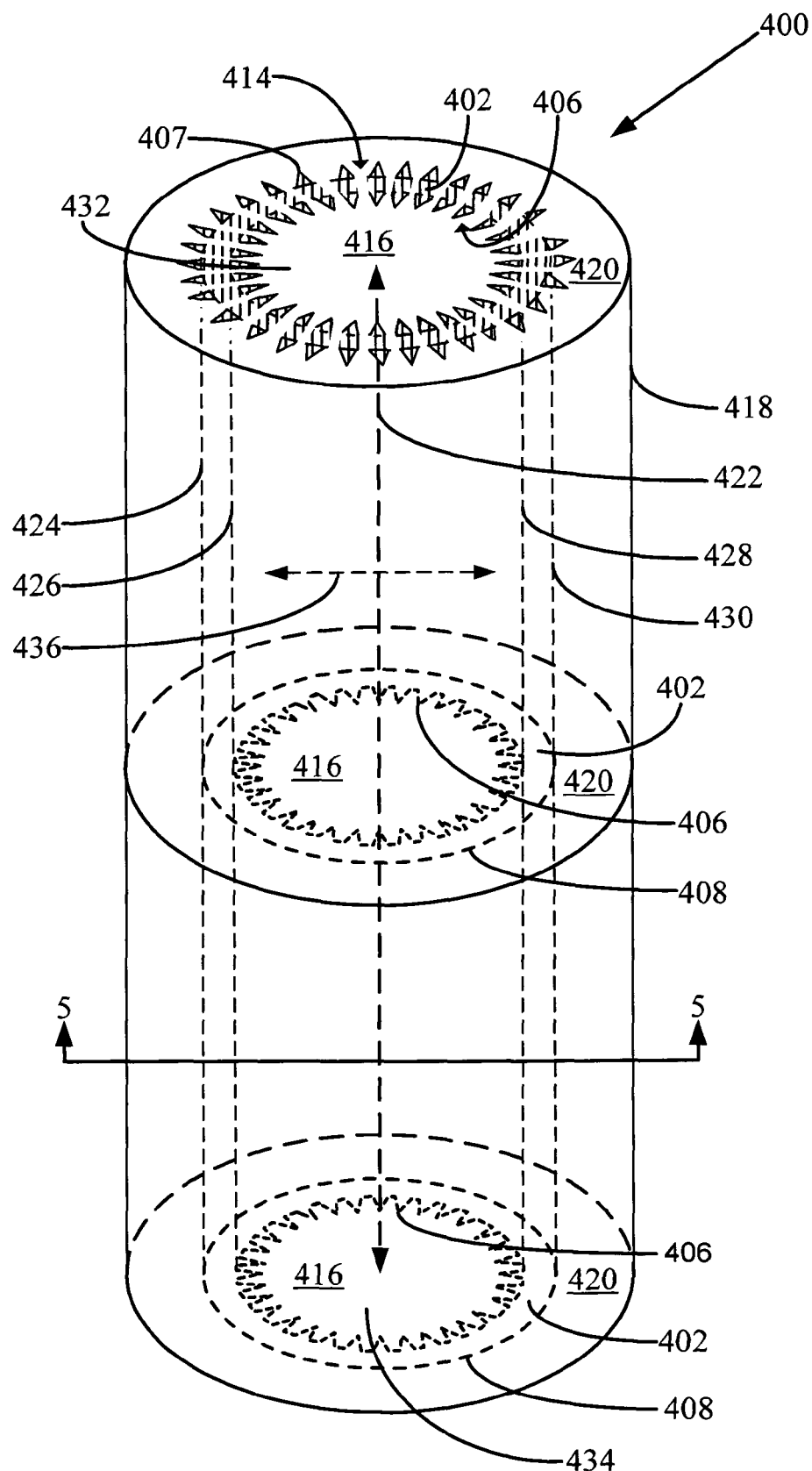
FIG. 4 is a perspective view showing an example of an apparatus including a fluid-permeable body including a conduit and having a first fluid-permeable body surface, and a plurality of raised micro-scale features on the first fluid-permeable body surface.
Figure 5:
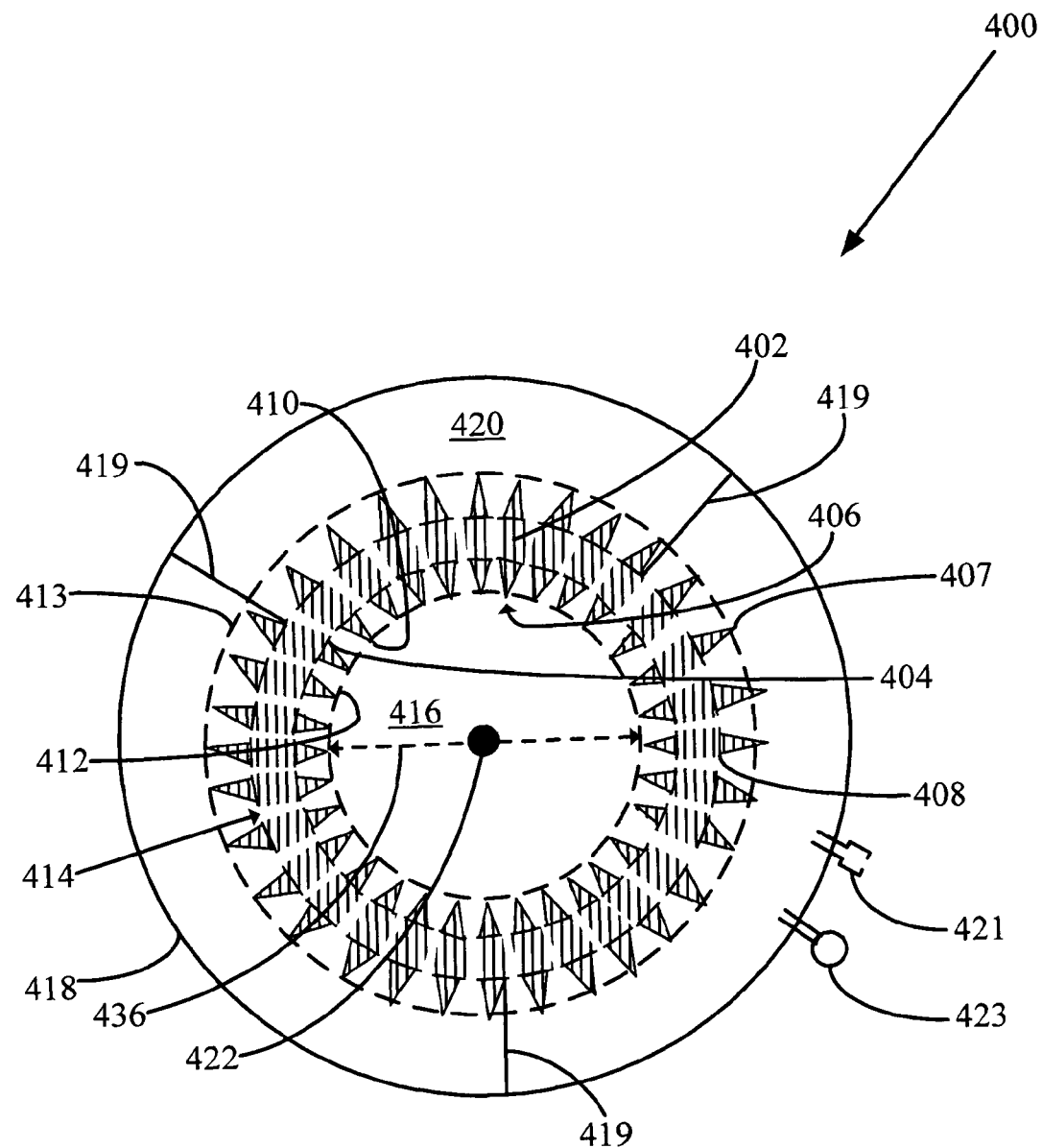
FIG. 5 is a cross-sectional side view taken on line 5-5, showing the apparatus of FIG. 4.

FIG. 4 is a perspective view showing an example of an apparatus 400, including a fluid-permeable body 402 including a conduit and having a first fluid-permeable body surface 404, and a plurality of raised micro-scale features 406 on the first fluid-permeable body surface 404. FIG. 5 is a cross-sectional side view taken on line 5-5, showing the apparatus 400 of FIG. 4. FIGS. 4 and 5 illustrate an example of an apparatus 100 in which the fluid-permeable body 102 is selected to include a conduit. The above discussion of the apparatus 100 is accordingly applicable to and is deemed incorporated in its entirety in the following discussion of FIGS. 4 and 5. The fluid-permeable body 402 includes a second fluid-permeable body surface 408 in addition to the first fluid-permeable body surface 404. In an example, each of a plurality of the raised micro-scale features 406 may include an end 410, the ends 410 being spaced apart at a distance from the first fluid-permeable body surface 404, the ends 410 forming a superhydrophobic surface 412. As another example (shown only in FIG. 5 and at the top of FIG. 4), the apparatus 400 may likewise include a plurality of raised micro-scale features 407 on the second fluid-permeable body surface 408, forming another superhydrophobic surface 413. A plurality of raised micro-scale features 406 or 407 or both may be, as an example, monolithic with the fluid-permeable body 402. The fluid-permeable body 402 includes a plurality of fluid-permeable cells 414. Each of a plurality of the fluid-permeable cells 414 includes a cell wall (not shown) defining a fluid pathway (not shown) communicating with openings (not shown) respectively in the first fluid-permeable body surface 404 and the second fluid-permeable body surface 408. In examples (not shown), the fluid-permeable body 402 may include fluid-permeable cells 414 that are oriented in a first array, and having ridges, fluid pathways, cell walls, and openings in the first fluid-permeable body surface 404 and in the second fluid-permeable body surface 408, that are selected in the same manner as discussed earlier in connection with the apparatus 100. As an example, the apparatus 400 may include a plurality of raised micro-scale features 406 that are positioned in a second array on the first fluid-permeable body surface 404, the second array being different than the first array, and the first and second arrays being selected in the same manner as discussed above with respect to the apparatus 100. Likewise as a further example, the apparatus 400 may include a plurality of raised micro-scale features 407 that are positioned in a second array on the second fluid-permeable body surface 408, the second array being different than the first array.

As examples, a portion or all of the fluid-permeable body 402 may form a first fluid containment structure 416 including a conduit. As an example, the first fluid-permeable body surface 404 may form an interior region of the conduit. As another example, the fluid-permeable body 402 may be have a rigid structure suitable for maintaining its shape. In further examples, any or all of the elements of an apparatus 400 shown in the figures and discussed in this specification may be rigid, and may be capable of maintaining their shapes in utilization of the apparatus 400. In another example, the fluid-permeable body 402 may form a first fluid containment structure 416 including a tubular conduit, having a tubular cross-section in the same manner as discussed earlier with regard to the apparatus 100. Background information on conduits including raised micro-scale features is disclosed in commonly-owned U.S. patent application Ser. No. 11/416,893, filed on May 3, 2006, entitled "Superhydrophobic. Surfaces and Fabrication Process", the entirety of which hereby is incorporated herein by reference.

In an example, the apparatus 400 may include a fluid containment body 418. As another example, the fluid containment body 418 may, together with the second fluid-permeable body surface 408, form a second fluid containment structure 420. In an example where the fluid-permeable body 402 may form a first fluid containment structure 416 including a tubular conduit, the second fluid containment structure 420 may occupy a space surrounding the first fluid containment structure 416 including a tubular conduit, and may generally have an annular shape. As another example, the apparatus 400 may include one or a plurality of support members 419 connecting the fluid-permeable body 402 with the fluid containment body 418. A support member 419 may, as an example, maintain the fluid-permeable body 402 in a selected position with respect to the fluid containment body 418 in the same manner as discussed above with respect to the apparatus 100. As further examples, the apparatus 400 may include a first fluid containment structure 416 and a second fluid containment structure 420, and the second fluid containment structure 420 may be selected to be a fluid pressure containment chamber in the same manner as discussed above in connection with the apparatus 100. In another example, either or both of the first and second fluid containment structures 416 and 420 may include one or a plurality of fittings 421 or fluid pressure gauges 423 or both, provided and operated in an analogous manner as discussed earlier in connection with the apparatus 100.

In an example, a plurality of raised micro-scale features 406 may extend from the first fluid-permeable body surface 404 generally in directions toward a longitudinal axis 422. As an example, boundaries of the fluid-permeable body 402 including a tubular conduit may be schematically defined by example dotted lines 424, 426, 428 and 430. Ends 432, 434 of the apparatus 400 may facilitate passage of a fluid (not shown) through the apparatus 400 generally in the directions of the arrows at the ends of the longitudinal axis 422.

In another example, the longitudinal axis 422 may include a curved region (not shown), and the first fluid-permeable body surface 404 may generally follow the curve. As examples, the curve may be gradual or may include an abrupt bend. The longitudinal axis 422 may also include a straight region, or the entire longitudinal axis 422 may be curved. The first fluid containment structure 416 including a conduit may have a diameter 436 represented by a dotted line with arrows and defined in a direction transverse to the longitudinal axis 422. In an example, the fluid-permeable body 402 may have a generally cylindrical outer shape, so that the apparatus 400 may have the overall shape of a pipe. In another example where the apparatus 400 may include a second fluid containment structure 420, the second fluid containment structure 420 may also have a generally cylindrical outer shape, so that the apparatus 400 may have the overall shape of a pipe. As a further example (not shown) the fluid-permeable body 402 or, if also present, the second fluid containment structure 420, may include additional material, such that the apparatus 400 may have another selected outer shape. In a further example (not shown) the apparatus 400 may be integrated into a device having further components.

As an example, the diameter 436 of the first fluid containment structure 416 may be uniform along the longitudinal axis 422. As another example (not shown), the diameter 436 of the first fluid containment structure 416 may include two or more different values at different positions along the longitudinal axis 422. In a further example (not shown), values for the diameter 436 may define a grade or another patterned variation in one or both directions along the longitudinal axis 422, forming a funnel or pipette tip as examples.

Figure 6:
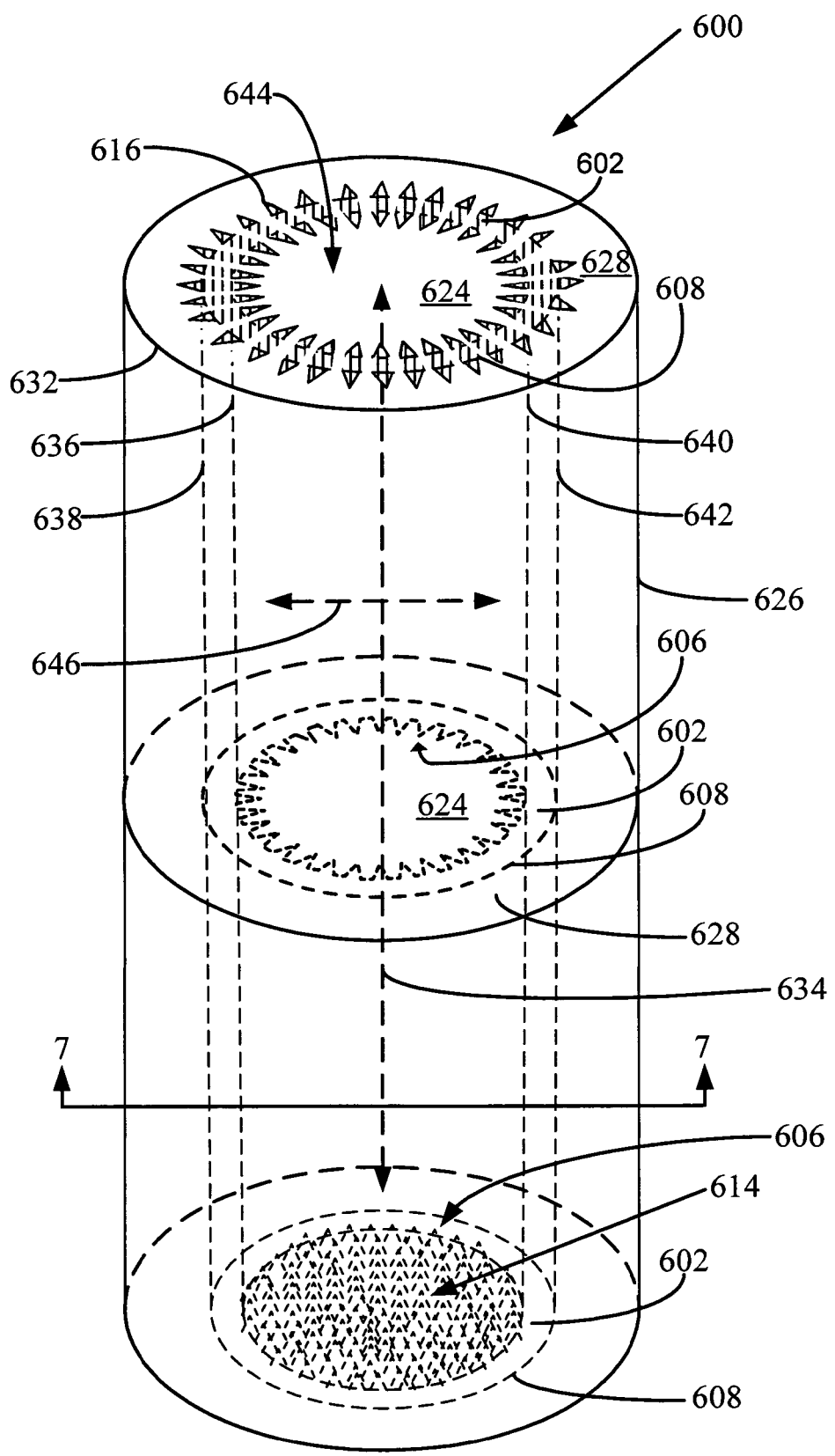
FIG. 6 is a perspective view showing an example of an apparatus including a fluid-permeable body including a cavity and having a first fluid-permeable body surface, and a plurality of raised micro-scale features on the first fluid-permeable body surface.
Figure 7:
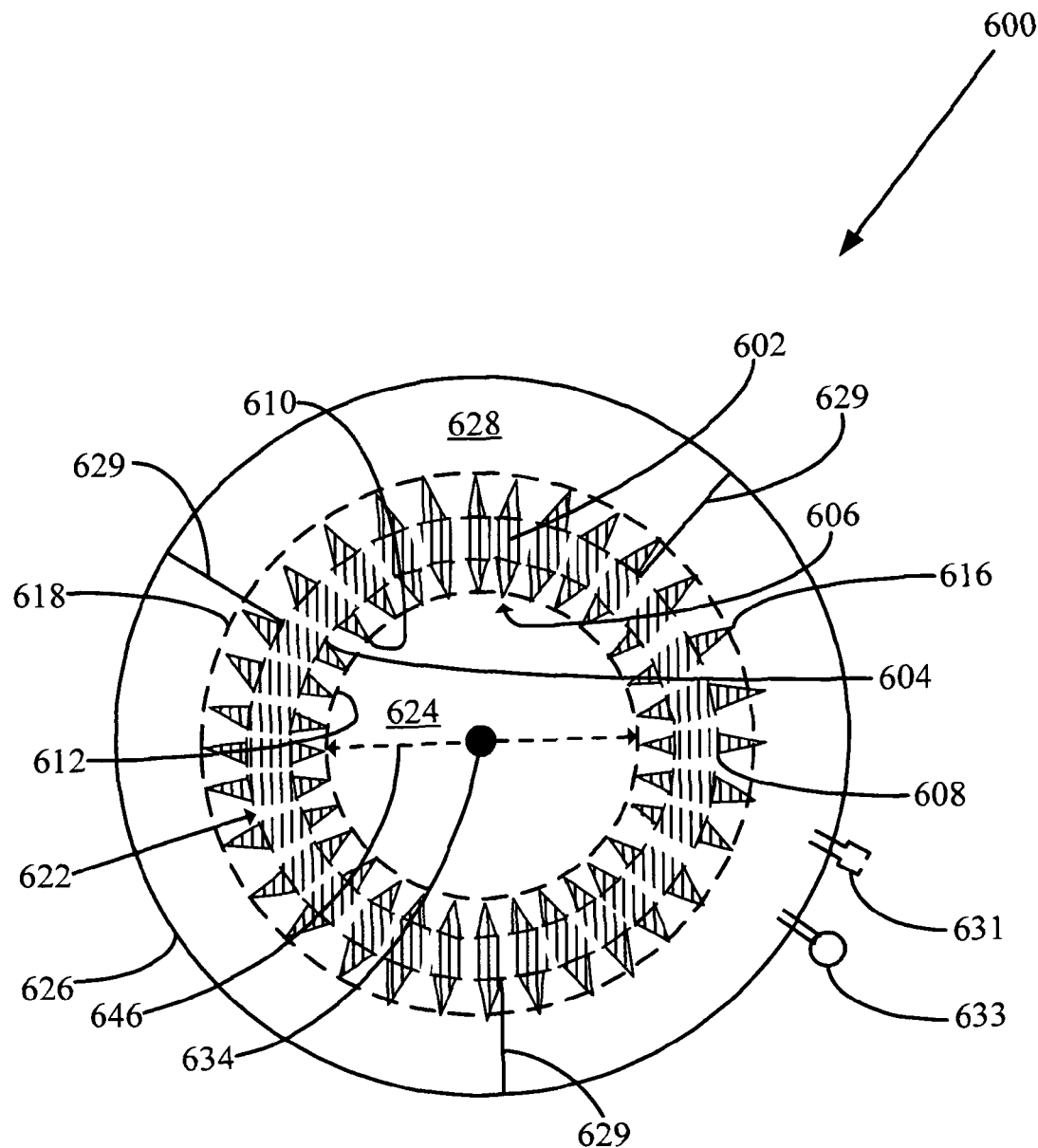
FIG. 7 is a cross-sectional side view taken on line 7-7, showing the apparatus of FIG. 6.

FIG. 6 is a perspective view showing an example of an apparatus 600, including a fluid-permeable body 602 including a cavity and having a first fluid-permeable body surface 604, and a plurality of raised micro-scale features 606 on the first fluid-permeable body surface 604. FIG. 7 is a cross-sectional side view taken on line 7-7 showing the apparatus 600 of FIG. 6. FIGS. 6 and 7 illustrate an example of an apparatus 100 in which the fluid-permeable body 102 is selected to include a cavity. The above discussions of the apparatus 100, 400 are accordingly applicable to and are deemed incorporated in their entireties in the following discussion of FIGS. 6 and 7. The fluid-permeable body 602 includes a second fluid-permeable body surface 608 in addition to the first fluid-permeable body surface 604. In an example, each of a plurality of the raised micro-scale features 606 may include an end 610, the ends 610 being spaced apart at a distance from the first fluid-permeable body surface 604, the ends 610 forming a superhydrophobic surface 612 including a floor 614. As another example (shown only in FIG. 7 and at the top of FIG. 6), the apparatus 600 may likewise include a plurality of raised micro-scale features 616 on the second fluid-permeable body surface 608, forming another superhydrophobic surface 618. A plurality of raised micro-scale features 606 or 616 or both may be, as an example, monolithic with the fluid-permeable body 602. The fluid-permeable body 602 includes a plurality of fluid-permeable cells 622. Each of a plurality of the fluid-permeable cells 622 includes a cell wall (not shown) defining a fluid pathway (not shown) communicating with openings (not shown) respectively in the first fluid-permeable body surface 604 and the second fluid-permeable body surface 608. In examples (not shown), the fluid-permeable body 602 may include fluid-permeable cells 622 that are oriented in a first array, and having ridges, fluid pathways, cell walls, and openings in the first fluid-permeable body surface 604 and in the second fluid-permeable body surface 608, that are selected in the same manner as discussed earlier in connection with the apparatus 100. As an example, the apparatus 600 may include a plurality of raised micro-scale features 606 that are positioned in a second array on the first fluid-permeable body surface 604, the second array being different than the first array, and the first and second arrays being selected in the same manner as discussed above with respect to the apparatus 100. Likewise as a further example, the apparatus 600 may include a plurality of raised micro-scale features 616 that are positioned in a second array on the second fluid-permeable body surface 608, the second array being different than the first array.

As examples, a portion or all of the fluid-permeable body 602 may form a first fluid containment structure 624 including a cavity. As an example, the first fluid-permeable body surface 604 may form an interior region of the cavity. As another example, the fluid-permeable body 602 may be have a rigid structure suitable for maintaining its shape. In further examples, any or all of the elements of an apparatus 600 shown in the figures and discussed in this specification may be rigid, and may be capable of maintaining their shapes in utilization of the apparatus 600. In another example, the fluid-permeable body 602 may form a first fluid containment structure 624 including a tubular cavity, having a tubular cross-section in the same manner as discussed earlier with regard to the apparatus 100. Background information on cavities including raised micro-scale features is disclosed in commonly-owned U.S. patent application Ser. No. 11/416,893, filed on May 3, 2006, entitled "Superhydrophobic Surfaces and Fabrication Process".

In an example, the apparatus 600 may include a fluid containment body 626. As another example, the fluid containment body 626 may, together with the second fluid-permeable body surface 608, form a second fluid containment structure 628. In an example where the fluid-permeable body 602 may form a first fluid containment structure 624 including a tubular cavity, the second fluid containment structure 628 may occupy a space surrounding the first fluid containment structure 624 including a tubular cavity, and may itself generally have a cavity shape. As another example, the apparatus 600 may include one or a plurality of support members 629 connecting the fluid-permeable body 602 with the fluid containment body 626. A support member 629 may, as an example, maintain the fluid-permeable body 602 in a selected position with respect to the fluid containment body 626 in the same manner as discussed above with respect to the apparatus 100. In an example, a second fluid containment structure 628 may be selected to be a fluid pressure containment chamber, by including in the apparatus 600 a cover (not shown) forming a seal at the line 632 with the second fluid-permeable body surface 608 and with the fluid containment body 626. In another example, either or both of the first and second fluid containment structures 624 and 628 may include one or a plurality of fittings 631 or fluid pressure gauges 633 or both, provided and operated in an analogous manner as discussed earlier in connection with the apparatus 100.

In an example, a plurality of raised micro-scale features 606 may extend from the first fluid-permeable body surface 604 generally in directions toward the longitudinal axis 634. As an example, boundaries of the fluid-permeable body 602 may be schematically defined by example dotted lines 636, 638, 640 and 642. An open end 644 in the apparatus 600 may facilitate passage of a fluid (not shown) into and out of the apparatus 600 generally in the directions of the arrows at the ends of the longitudinal axis 634.

In another example, the longitudinal axis 634 may include a curved region (not shown), and the first fluid-permeable body surface 604 may generally follow the curve. As examples, the curve may be gradual or may include an abrupt bend. The longitudinal axis 634 may also include a straight region, or the entire longitudinal axis 634 may be curved. The first fluid containment structure 624 including a cavity may have a diameter 646 represented by a dotted line with arrows and defined in a direction transverse to the longitudinal axis 634. In an example, the fluid-permeable body 602 may have a generally cylindrical outer shape, so that the apparatus 600 may have the overall shape of a cup. In another example where the apparatus 600 may include a second fluid containment structure 628, the second fluid containment structure 628 may also have a generally cylindrical outer shape, so that the apparatus 600 may have the overall shape of a cup. As a further example (not shown) the fluid-permeable body 602 or, if also present, the second fluid containment structure 628, may include additional material, such that the apparatus 600 may have another selected outer shape. In a further example (not shown) the apparatus 600 may be integrated into a device having further components.

As an example, the diameter 646 of the first fluid containment structure 624 may be uniform along the longitudinal axis 634. As another example (not shown), the diameter 646 of the first fluid containment structure 624 may include two or more different values at different positions along the longitudinal axis 634. In a further example (not shown), values for the diameter 646 may define a grade or another patterned variation in one or both directions along the longitudinal axis 634, forming a flask or bowl as examples. In an example, the diameter 646 of the first fluid containment structure 624 may have a length of about 5 millimeters, and a depth of the tubular cavity in the directions of the longitudinal axis 634 may be about 7 millimeters.

As an example, the apparatus 600 may be incorporated into a larger device (not shown) so that the fluid-permeable body 602 may be integrated with additional material (not shown). In an example, a plurality of apparatus 600 may have their longitudinal axes 634 aligned in a mutually parallel spaced apart array, each apparatus 600 having an open end 644, the open ends 644 aligned in a plane (not shown). As an example, ninety-six apparatus 600 may collectively form a standard 96-well micro-well plate for utilization in carrying out biological and chemical tests. In an example, the raised micro-scale features 606 may facilitate self-cleaning of reagents from the apparatus 600 after completion of aqueous phase tests.

Figure 8:
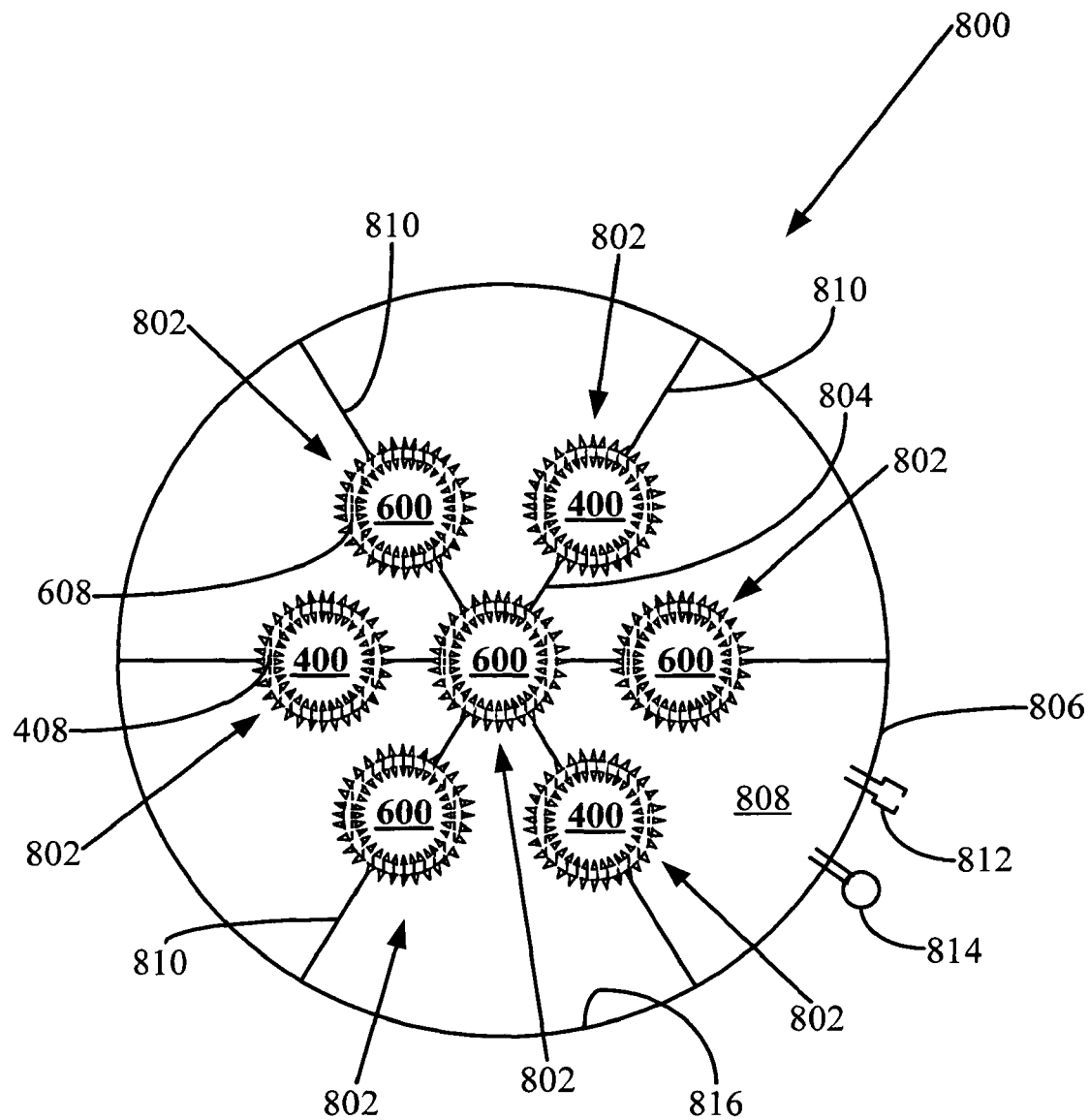
FIG. 8 is a cross-sectional view of an example of an apparatus selected to include either a plurality of apparatus having a conduit, or a plurality of apparatus having a cavity, or a plurality of apparatus that includes apparatus having a conduit and apparatus having a cavity.

FIG. 8 is a cross-sectional view of an example of an apparatus 800 selected to include a plurality of apparatus 802. As an example, an apparatus 800 may include one or more apparatus 400 and one or more apparatus 600. The above discussions of the apparatus 100, 400 and 600 accordingly are applicable to and are deemed incorporated in their entirety in the following discussion of FIG. 8. In an example, the apparatus 800 may include seven (7) apparatus 802, each apparatus 802 independently selected as either an apparatus 400 or an apparatus 600. As another example, the apparatus 800 may include four (4) apparatus 400 and three (3) apparatus 600 arranged with respect to each other as shown in FIG. 8. It is understood that any quantity of apparatus 802, any selection among apparatus 400 and 600, and any arrangement of apparatus 400 and 600 with respect to each other may be selected for inclusion in the plurality of apparatus 802 in the apparatus 800. As examples, a quantity of between 2 and about 1,000, or between 2 and about 100, or between 2 and about 10 apparatus 802 may be included in the apparatus 800. As earlier discussed, an apparatus 400 as shown in FIGS. 4-5 may as an example include one fluid-permeable body 402 selected to include a conduit, having a first fluid-permeable body surface 404, and a second fluid-permeable body surface 408. Further as earlier discussed, an apparatus 600 as shown in FIGS. 6-7 may as an example include one fluid-permeable body 602 selected to include a cavity, having a first fluid-permeable body surface 604, and a second fluid-permeable body surface 608. It is understood that each of the apparatus 400 and 600 includes additional features and may be selected to include further features, as have already been explained above. In an example, inclusion of a plurality of apparatus 400, 600 in an apparatus 800 may facilitate higher rates of interaction between fluids in utilization of the apparatus 800 than may occur in a single such apparatus 400, 600. As another example, the apparatus 800 may include one or a plurality of support members 804 between pairs of apparatus 802. A support member 804 may, as an example, maintain pairs of apparatus 802 in a selected position with respect to each other.

In an example, the apparatus 800 may include a fluid containment body 806. As another example, the fluid containment body 806 may, together with the second fluid-permeable body surfaces 408, 608, form a second fluid containment structure 808. As another example, the fluid-second fluid containment structure 808 may be have a rigid structure suitable for maintaining its shape. In further examples, any or all of the elements of an apparatus 800 shown in the figures and discussed in this specification may be rigid, and may be capable of maintaining their shapes in utilization of the apparatus 800. In an example, the second fluid containment structure 808 may occupy a space surrounding the apparatus 802, and may generally have an annular shape in the same manner as shown in FIGS. 4 and 6. As another example, the apparatus 800 may include one or a plurality of support members 810 connecting the second fluid-permeable body surfaces 408, 608 with the fluid containment body 806. A support member 810 may, as an example, maintain an apparatus 400, 600 in a selected position with respect to the fluid containment body 806. As further examples, the second fluid containment structure 808 may be selected to be a fluid pressure containment chamber in the same manner as discussed above in connection with the apparatus 100. In another example, the second fluid containment structure 808 may include one or a plurality of fittings 812 or fluid pressure gauges 814 or both, provided and operated in an analogous manner as discussed earlier in connection with the apparatus 100. As a further example, an interior surface 816 of the fluid containment body 806 may (not shown) include a plurality of raised micro-scale features including ends spaced apart at a distance from the interior surface 816 forming a superhydrophobic surface.

In another example, the longitudinal axes 422 of any apparatus 400 and the longitudinal axes 634 of any apparatus 600 selected for inclusion in the apparatus 800 may be mutually parallel. As another example where all longitudinal axes 422, 634 are mutually parallel, the apparatus 800 may include a curved region (not shown), and the first fluid-permeable body surfaces 404, 604 may generally follow the curve. As examples, the curve may be gradual or may include an abrupt bend. The longitudinal axes 422, 634 may also, as examples, include a straight region, or the entire longitudinal axes 422, 634 may be curved. In another example, any first fluid containment structures 416, 624 included in the apparatus 800 may have the same diameter or different diameters 436, 646. As an example, the diameters 436, 646 may be uniform along the longitudinal axes 422, 634, or may each independently include two or more different values at different positions along the longitudinal axes 422, 634, or values for the diameters 436, 646 may each independently define a grade or another patterned variation in one or both directions along the longitudinal axes 422, 634. In an example, the second fluid containment structure 808 may have a generally cylindrical outer shape. As a further example (not shown) the second fluid containment structure 808 may include additional material, such that the apparatus 800 may have another selected outer shape. In a further example (not shown) the apparatus 800 may be integrated into a device having further components.

Figure 9:
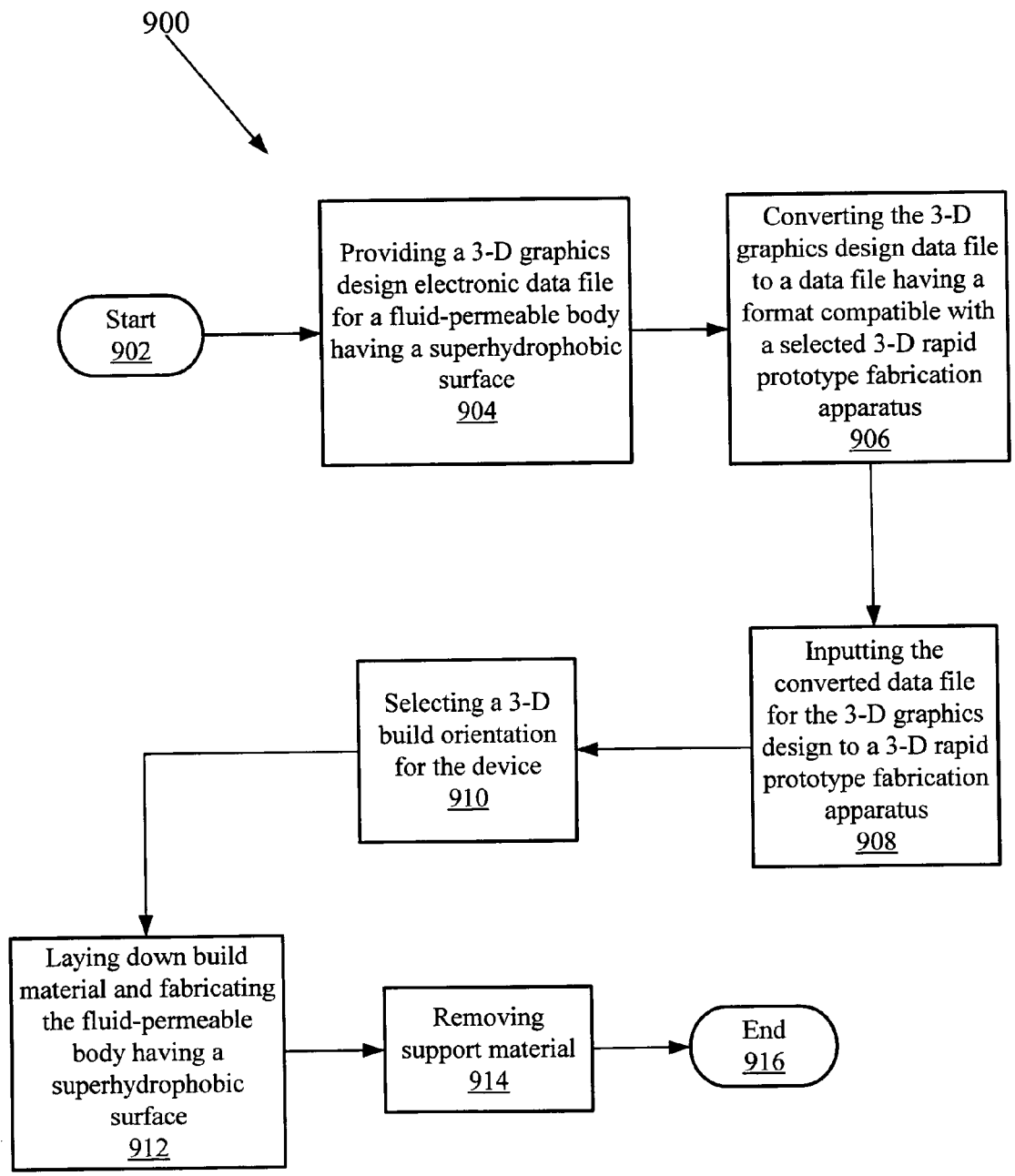
FIG. 9 is a flow-chart showing an example of a process for fabricating an apparatus as shown in FIGS. 1-8.

FIG. 9 is a flow-chart showing an example of a process 900 for fabricating an apparatus 100, 400, 600, 800 as shown in FIGS. 1-8. The process 900 starts at step 902, and at step 904 a three-dimensional ("3-D") graphics design electronic data file is provided for an apparatus 100, 400, 600, 800 as discussed above in connection with FIGS. 1-8. The 3-D graphics design may be created using a 3-D graphics computer program, also known as computer-aided-design ("CAD"). As examples, the 3ds Max surface modeling program commercially available from Autodesk, Inc., 111 McInnis Parkway, San Rafael, Calif. 94903 may be utilized. In another example, the PRO/Engineer solid modeling program commercially available from Parametric Technology Corporation, 140 Kendrick St., Needham, Mass. 02494 may be utilized.

At step 906, the 3-D graphics design data file may be converted to an electronic data file having a format that is compatible with a selected 3-D rapid prototype fabrication ("RPF") apparatus. At step 908, the converted 3-D graphics data file is input to a selected 3-D rapid prototype fabrication apparatus.

In an example, the 3-D rapid prototype fabrication apparatus may then be used to convert the 3-D graphics data file into an apparatus 100, 400, 600, 800 by successively laying down layers of a build material for the apparatus 100, 400, 600, 800.

Among examples of laydown processes carried out by commercially-available RPF apparatus that may be selected for utilization to fabricate the apparatus 100, 400, 600, 800 by the process 900 are the following: thermal phase change ink jet deposition, photopolymer phase change ink jet deposition, stereolithography ("SLA"), solid ground curing ("SGC"), selective laser sintering ("SLS"), fused deposition modeling ("FDM"), laminated object manufacturing ("LOM"), and 3-D printing ("3DP"). Each of these processes may involve the successive laydown of thin layers of build material for the apparatus 100, 400, 600, 800 on a support surface. The support surface may be a solid platform or a liquid surface on which the build material is caused to float. In the event that build material needs to be laid down at a location spaced apart above the support surface, then a support material on which the spaced apart build material can subsequently be deposited is laid down when and where needed for that purpose, arranged for its subsequent removal. As examples, the support material may be wax that can be removed by heat, or a material that can be selectively dissolved.

Each of these processes lays down build material in either liquid or solid form. Processes involving laydown of build material in a liquid form include thermal phase change ink jet, photopolymer phase change ink jet, and SLA processes. Utilization of the ink jet processes may result in fabrication of relatively high quality apparatus 100, 400, 600, 800, as solidification of the liquid build material sprayed from the ink jets may occur with minimal void formation. Moreover, the liquid build material sprayed from the ink jets may have a very small particle size, such a particle size permitting fabrication of raised micro-scale features having relatively small dimensions. Minimum feasible dimensions for the raised micro-scale features may, however, be limited by flow dynamics of the liquid build material in the ink jet system. Thermal phase change ink jet apparatus may employ limited types of build materials compatible with the ink jets and suitable for solidification on cooling, which may yield relatively tough but brittle apparatus 100, 400, 600, 800. Photopolymer phase change ink jet apparatus may employ broader classes of build materials compatible with the ink jets and suitable for curing upon exposure to ultraviolet light, which may yield either rigid or relatively flexible apparatus 100, 400, 600, 800. In an example, an InVision HR 3-D Printer commercially available from 3D-Systems, Inc., 26081 Avenue Hall, Valencia, Calif. 91355 may be utilized; and an initial 3-D graphics electronic data file may be converted into an STL file format at step 906. As an example, VisiJet® HR-200 Plastic Material, commercially available from 3-D Systems, Inc., may be utilized as the build material. VisiJet® HR-200 Plastic Material includes triethylene glycol dimethacrylate ester, urethane acrylate polymer, and propylene glycol monomethacrylate. SLA may employ a liquid photopolymer, over a vat of which an ultraviolet light laser may be traced, the solidified layers of liquid photopolymer being lowered into the vat. SGC may employ similar techniques, but the solidified layers are supported on a solid build platform.

Processes involving laydown of build material in a solid form include SLS, FDM, LOM and 3DP. SLS may employ a leveling roller that moves back and forth over two build material powder magazines, and a laser that selectively sinters build material powder layers from powder coatings applied by the roller onto a build platform. A 3DP process may employ a bed of build material powder, onto which an adhesive is selectively sprayed by an ink jet to form successive layers of bound build material. The 3DP process may yield apparatus 100, 400, 600, 800 having a relatively coarse, porous structure as a result of uneven wetting of the powder by the adhesive, and the presence of voids between bound build material particles. Excessive application of the adhesive may result in fabrication of relatively or excessively large raised micro-scale features. In an example, a build material powder having a narrow particle size distribution and very small particles may be selected. As another example, packing uniformity of the powder before adhesive application may be carefully controlled. As an example, a build material powder having an average particle size at least about ten times smaller than an average size of adhesive droplets sprayed by the ink jets may be selected. Such a build material powder may result in less shrinkage of the apparatus 100, 400, 600, 800 as it is built, than may otherwise result when utilizing ink jet printing of a liquid build material. An FDM process may employ melting and ink jet spraying of a plastic wire. A LOM process may involve successive laser cutting and bonding of thin layers of a sheet of build material. In an example where a ceramic powder may be selected as build material for an apparatus 100, 400, 600, 800, an SLS process may be utilized to sinter the powder. It is understood by those skilled in the art that any ceramic composition suitable for sintering by an SLS process or its equivalent may be utilized. As an example where a non-hydrophobic ceramic composition is selected, a hydrophobic layer may be applied onto the raised micro-scale features of the apparatus formed of the sintered ceramic. Such a hydrophobic layer may be applied, in an example, by a chemical vapor deposition process. In an example, a perfluorinated hydrocarbon coating composition may be utilized. It is understood by those skilled in the art that other hydrophobic coating compositions may be utilized.

As a further example, a 3-D rapid prototype fabrication apparatus may be programmed with a negative image of the apparatus 100, 400, 600, 800 so that support material is laid down instead of build material to fabricate the apparatus 100, 400, 600, 800. In an example, VisiJet® S-100 Model Material, a hydroxylated wax composition commercially available from 3-D Systems, Inc., may be utilized as the build material.

At step 910, a 3-D build orientation for the apparatus 100, 400, 600, 800 may be selected. As an example, referring to FIG. 4, an apparatus 400 may be built either in the direction of the longitudinal axis 422 or in a transverse direction parallel to the diameter 436 of the first fluid containment structure 416. In an example, a build orientation for an apparatus 400 may be selected so that raised micro-scale features 406, 407 and a second fluid containment structure 420, if included, are built in a direction such that a need for deposition of support material for them is minimized during their fabrication. As an example, fabrication of an apparatus 400 in the direction of the longitudinal axis 422 using SLA may facilitate a reduced laydown of support material. In another example where raised micro-scale features 406, 407 are selected in the form of continuous ridges, fabrication of an apparatus 400 in the direction of the longitudinal axis 422 using SLA, FDM, LOM, 3DP, or an InVision jet printer may require laydown of still less support material.

Figure 10:
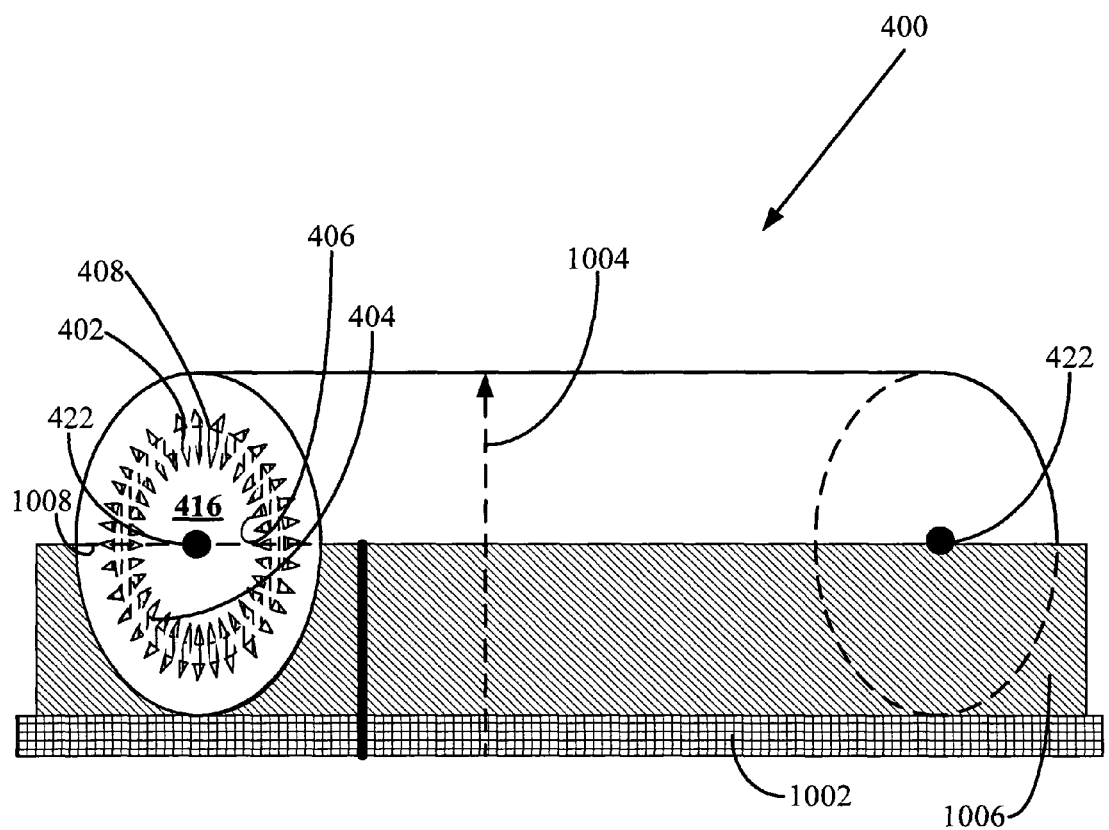
FIG. 10 is a perspective view showing an example of an apparatus as shown in FIGS. 4-5 during fabrication according to a process of FIG. 9.

FIG. 10 is a perspective view showing an example of an apparatus 400 as shown in FIGS. 4-5 during fabrication according to a process of FIG. 9. The apparatus 400 as shown in FIG. 10 includes a fluid-permeable body 402 having a first fluid-permeable body surface 404 that bounds a first fluid containment structure 416 having a longitudinal axis 422; the first fluid-permeable body 402 including a second fluid-permeable body surface 408; the first fluid-permeable body surface 404 including raised micro-scale features 406 and the second fluid-permeable body surface 408 including raised micro-scale features 407. As an example, an apparatus 400 may be fabricated on a build support 1002 in the direction of the arrow 1004. Support material 1006 may be laid down on the build support 1002 as the apparatus 400 is built. The support material 1006 may (not shown) fill the first fluid containment structure 416 up to the line 1008 surrounding the fluid permeable body 402 and raised micro-scale features 406, 407. As another example, if raised micro-scale features are built beginning with their tips and ending with formation of the fluid-permeable body holding them together, then the entire void space between the raised micro-scale features may need to be filled with support material during laydown of the build material.

At step 912, build material may be laid down on a build support, and a fluid-permeable body and raised micro-scale features may be monolithically fabricated. As an example, an apparatus 400 may accordingly be fabricated as shown in FIG. 10. In an example, each cycle of laydown of a layer of the build material may include milling of the layer to maintain level deposition of build material in the direction of the arrow 1004. In this manner, precise build dimensions of the resulting apparatus 400 may be controlled. As an example, raised micro-scale features 406 may be fabricated from a flexible material so that milling results in clean abrasion of the currently-deposited layer of build material, rather than breakage of the raised micro-scale features 406. In an example, ink jet nozzles, if employed by the 3-D rapid prototype fabrication apparatus, may be tested after each laydown cycle to detect and remove any jet nozzle clogs.

Where, as in FIG. 9, support material may be laid down in order to provide mechanical support for an apparatus 100, 400, 600, 800 during fabrication, the support material may subsequently be removed at step 914. As examples, a support material composition may be selected such that the support material may be selectively removed by application of heat or by selective dissolution of the support material in a suitable solvent. As an example, the support material may be a wax. The process 900 then ends at step 916.

The process 900 may also be utilized in similar manners to fabricate the apparatus 100, 400, 600 or 800. In an example where an apparatus 600 is fabricated, at step 910 a 3-D build orientation may be selected so that the raised micro-scale features 606 may be fabricated first on a floor 614 of a first fluid-permeable body surface 604 and then on the remainder of the first fluid-permeable body surface 604, in a general direction toward the open end 644.

FIG. 11 is a flow chart showing an implementation of a method 1100 of treating a liquid with a fluid. The preceding discussions of the fabrication, structures and operation of the apparatus 100, 400, 600 and 800 are incorporated in their entireties into this discussion of the method 1100. The method 1100 begins at step 1102 and at step 1104 a selected apparatus 100, 400, 600, 800 as earlier discussed is provided including: a fluid-permeable body including a first fluid containment structure and having first and second fluid-permeable body surfaces; a plurality of fluid-permeable cells in the fluid-permeable body, each of a plurality of the fluid-permeable cells having a cell wall defining a fluid pathway communicating with openings in both the first and second fluid-permeable body surfaces; a plurality of raised micro-scale features on the first fluid-permeable body surface; and a fluid containment body forming, together with the second fluid-permeable body surface, a second fluid containment structure. At step 1106, a first liquid is introduced into the first fluid containment structure and a fluid is introduced into the second fluid containment structure, whereby interaction is allowed to occur between the first liquid and the fluid through the fluid-permeable body. The method may end at step 1108. In an example, the method may include maintaining a pressure in the first fluid containment structure within a selected range relative to a pressure in the second fluid containment structure. As another example, the method may include allowing interaction to occur, through the fluid-permeable body, between the first liquid and a gas in the fluid. As a further example, the method may include providing an apparatus including a plurality of raised micro-scale features on the second fluid-permeable body surface; and introducing a second liquid into the second fluid containment structure and allowing interaction to occur between the first and second liquids through the fluid-permeable body.

FIG. 12 is a flow chart showing an implementation of a method 1200 of maintaining a superhydrophobic surface. The preceding discussions of the fabrication, structures and operation of the apparatus 100, 400, 600 and 800 are incorporated in their entireties into this discussion of the method 1200. The method 1200 begins at step 1202 and at step 1204 a selected apparatus 100, 400, 600 and 800 as earlier discussed is provided including: a fluid-permeable body including a first fluid containment structure and having first and second fluid-permeable body surfaces; a plurality of fluid-permeable cells in the fluid-permeable body, each of a plurality of the fluid-permeable cells having a cell wall defining a fluid pathway communicating with openings in both the first and second fluid-permeable body surfaces; a plurality of raised micro-scale features on the first fluid-permeable body surface; and a fluid containment body forming, together with the second fluid-permeable body surface, a second fluid containment structure. At step 1206, a first liquid is introduced into the first fluid containment structure, a gaseous fluid is introduced into the second fluid containment structure, and a pressure is maintained in the first fluid containment structure within a selected range relative to a pressure in the second fluid containment structure. The method may end at step 1208. In an example, the method may include causing the second fluid containment structure to be placed under an elevated pressure.

The apparatus 100, 400, 600 and 800 may be utilized in a broad range of end-use applications where a fluid-permeable body having a superhydrophobic surface may be useful. As examples, the apparatus 100, 400, 600, 800 may facilitate ultra low-friction fluid flows. Devices containing micro-fluid containment structures, such as biochips and microreactors, may be fabricated by the process 900 and may incorporate apparatus 100, 400, 600, 800. In an example, the apparatus 100, 400, 600, 800 may serve as temporary containers for biological and chemical reagents, or as reaction vessels, and may be self-cleaning where the reagents are in the form of aqueous solutions.

While the foregoing description refers in some instances to the apparatus 100, 400, 600, 800 as shown in FIGS. 1-10, it is appreciated that the subject matter is not limited to these structures, nor to the structures discussed in the specification. Other shapes and configurations including a fluid-permeable body having a superhydrophobic surface may be fabricated. Likewise, the disclosed process 900 may be utilized to fabricate additional apparatus including a fluid-permeable body having a superhydrophobic surface. Further, it is understood by those skilled in the art that the method of treating a liquid with a fluid shown in FIG. 11 and the method of maintaining a superhydrophobic surface shown in FIG. 12 may include additional steps and modifications of the indicated steps. It is understood that the end-utilization applications discussed above for each of the apparatus 100, 400, 600, 800 are likewise applicable to all of such apparatus. As examples, the apparatus 100, 400, 600, 800 may be utilized in: blood oxygenation; blood dialysis; commercial, chemical and biotechnological manufacturing; conveying a fluid within an apparatus at an increased flow rate, including microfluidics; and for removal of a gas or vapor from a liquid.

Moreover, it will be understood that the foregoing description of numerous examples has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

What is claimed is:

1. An apparatus, comprising:
    a rigid fluid-permeable body, having a first non-planar exterior surface, and having a second exterior surface facing away from the first non-planar exterior surface;
    a plurality of fluid-permeable cells in the fluid-permeable body, each of the fluid-permeable cells having an opening in the first non-planar exterior surface and another opening in the second exterior surface, and each of the fluid-permeable cells having a cell wall defining a fluid pathway communicating with the openings in both the first and the second exterior surfaces; and
    a plurality of raised micro-scale features on the first non-planar exterior, surface of the fluid-permeable body.

2. The apparatus of claim 1, wherein each of a plurality of the raised micro-scale features includes an end, the ends being spaced apart at a distance from the first non-planar exterior surface of the fluid-permeable body, the ends collectively forming a superhydrophobic surface.

3. The apparatus of claim 1, wherein the fluid-permeable body is monolithic, and wherein a plurality of the raised micro-scale features are monolithic with the fluid-permeable body.

4. The apparatus of claim 1, including another plurality of raised micro-scale features on the second exterior surface of the fluid-permeable body.

5. The apparatus of claim 1, wherein the first non-planar exterior surface of the fluid-permeable body forms a fluid containment structure.

6. The apparatus of claim 5, wherein the fluid containment structure is a fluid-permeable conduit.

7. The apparatus of claim 6, wherein the fluid-permeable conduit is a fluid-permeable cavity.

8. The apparatus of claim 5, being configured for applying a given pressure to a fluid within the fluid containment structure.

9. The apparatus of claim 1, wherein each of the cell walls has a first ridge defining one of the openings in and forming a portion of the first non-planar exterior surface, and a second ridge defining one of the openings in and forming a portion of the second exterior surface.

10. The apparatus of claim 9, wherein the first ridges are arranged in a first array and the second ridges are arranged in a second array.

11. The apparatus of claim 10, wherein the plurality of raised micro-scale features are arranged in a third array on the first ridges.

12. The apparatus of claim 9, wherein each of the first ridges has a shape that is triangular, square, rectangular, pentagonal, trapezoidal, heptagonal, polygonal, circular, or elliptical.

13. An apparatus, comprising:
   a rigid fluid-permeable body having a first exterior surface, and having a second exterior surface facing away from the first exterior surface;
   a plurality of fluid-permeable cells in the fluid-permeable body, each of the fluid-permeable cells having an opening in the first exterior surface and another opening in, the second exterior surface, and each of the fluid-permeable cells having a cell wall defining a fluid pathway communicating with the openings in both the first and the second exterior surfaces;
   a plurality of raised micro-scale features on the first exterior surface of the fluid-permeable body; and
   a fluid containment body forming, together with the second exterior surface of the fluid-permeable body, a fluid containment structure.

14. The apparatus of claim 13, wherein the fluid-permeable body is monolithic, and wherein a plurality of the raised micro-scale features are monolithic with the fluid-permeable body.

15. The apparatus of claim 13, including another plurality of raised micro-scale features on the second exterior surface or the fluid permeable body.

16. The apparatus of claim 13, wherein the fluid containment structure is a fluid pressure containment chamber.

17. The apparatus of claim 13, wherein the first exterior surface of the fluid-permeable body forms another fluid containment structure.

18. The apparatus of claim 17, wherein the another fluid containment structure is a fluid-permeable conduit.

19. The apparatus of claim 18, wherein the fluid-permeable conduit is a fluid-permeable cavity.

20. The apparatus of claim 13, wherein each of a plurality of the raised micro-scale features includes an end, the ends being spaced apart at a distance from the first exterior surface of the fluid-permeable body, the ends collectively forming a superhydrophobic surface.

21. The apparatus of claim 13, wherein each of the cell walls has a first ridge defining one of the openings in and forming a portion of the first non-planar exterior surface, and a second ridge defining one of the openings in and forming a portion of the second exterior surface.

22. The apparatus of claim 21, wherein the first ridges are arranged in a first array and the second ridges are arranged in a second array.

23. The apparatus of claim 22, wherein the plurality of raised micro-scale features are arranged in a third array on the first ridges.

24. The apparatus of claim 21, wherein each of the first ridges has a shape that is triangular, square, rectangular, pentagonal, trapezoidal, heptagonal, polygonal, circular, or elliptical.

25. The apparatus of claim 13, being configured for applying a given pressure to a fluid within the fluid containment structure.

* * * * *